(12) United States Patent
Ting et al.

(10) Patent No.: US 10,134,950 B2
(45) Date of Patent: Nov. 20, 2018

(54) MICRO LIGHT EMITTING DIODE AND MANUFACTURING METHOD THEREOF

(71) Applicant: Genesis Photonics Inc., Tainan (TW)

(72) Inventors: Shao-Ying Ting, New Taipei (TW); Yan-Ting Lan, Tainan (TW); Jing-En Huang, Tainan (TW); Yi-Ru Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/680,227

(22) Filed: Aug. 18, 2017

(65) Prior Publication Data

US 2018/0090639 A1 Mar. 29, 2018

Related U.S. Application Data

(60) Provisional application No. 62/376,890, filed on Aug. 18, 2016.

(51) Int. Cl.
*H01L 33/08* (2010.01)
*H01L 33/38* (2010.01)
(Continued)

(52) U.S. Cl.
CPC .......... *H01L 33/08* (2013.01); *H01L 25/0753* (2013.01); *H01L 27/15* (2013.01); *H01L 27/153* (2013.01); *H01L 27/156* (2013.01); *H01L 33/007* (2013.01); *H01L 33/0079* (2013.01); *H01L 33/20* (2013.01); *H01L 33/382* (2013.01);
(Continued)

(58) Field of Classification Search
CPC ....... H01L 33/08; H01L 27/156; H01L 27/15; H01L 27/153; H01L 33/385; H01L 33/382; H01L 33/20
See application file for complete search history.

(56) References Cited

U.S. PATENT DOCUMENTS

2011/0241064 A1 10/2011 Fang et al.
2011/0278634 A1 11/2011 Na et al.
(Continued)

FOREIGN PATENT DOCUMENTS

KR 20120079327 7/2012

OTHER PUBLICATIONS

"Office Action of US Related Application, U.S. Appl. No. 15/680,225", dated Mar. 21, 2018, p. 1-p. 16.
(Continued)

*Primary Examiner* — Bac Au
(74) *Attorney, Agent, or Firm* — JCIPRNET

(57) ABSTRACT

A μLED including an epitaxial stacked layer, a first electrode and a second electrode is provided. The epitaxial stacked layer includes a first type doped semiconductor layer, a light emitting layer and a second type doped semiconductor layer. The epitaxial stacked layer has a first mesa portion and a second mesa portion to form a first type conductive region and a second type conductive region respectively. The first electrode is disposed on the first mesa portion. The second electrode is disposed on the second mesa portion. The second electrode contacts the first type doped semiconductor layer, the light emitting layer and the second type doped semiconductor layer located at the second mesa portion. Moreover, a manufacturing method of the μLED is also provided.

25 Claims, 32 Drawing Sheets

(51) Int. Cl.
*H01L 33/20* (2010.01)
*H01L 33/44* (2010.01)
*H01L 25/075* (2006.01)
*H01L 33/00* (2010.01)
*H01L 27/15* (2006.01)
*H01L 33/06* (2010.01)

(52) U.S. Cl.
CPC ............ H01L 33/385 (2013.01); H01L 33/44 (2013.01); *H01L 33/06* (2013.01); *H01L 2933/0016* (2013.01)

(56) References Cited

U.S. PATENT DOCUMENTS

| | | | |
|---|---|---|---|
| 2012/0223345 A1* | 9/2012 | Tomoda | H01L 25/0753 257/89 |
| 2012/0228580 A1* | 9/2012 | Wang | H01L 27/156 257/13 |
| 2014/0034976 A1* | 2/2014 | Chu | H01L 33/08 257/93 |
| 2014/0210054 A1 | 7/2014 | Kosub et al. | |
| 2014/0312369 A1* | 10/2014 | Yoon | H01L 33/382 257/96 |
| 2015/0028362 A1 | 1/2015 | Chan et al. | |
| 2015/0086301 A1 | 3/2015 | Rogers et al. | |
| 2015/0091787 A1* | 4/2015 | Ohmae | F21K 9/00 345/83 |
| 2015/0108492 A1 | 4/2015 | Kuo | |
| 2015/0280065 A1 | 10/2015 | Wada | |
| 2015/0311415 A1* | 10/2015 | Song | H01L 27/156 257/91 |
| 2016/0111618 A1* | 4/2016 | Shur | H01L 33/641 257/94 |
| 2017/0018472 A1 | 1/2017 | Takamoto et al. | |
| 2017/0092540 A1 | 3/2017 | Rohleder et al. | |
| 2017/0229322 A1 | 8/2017 | Hsu et al. | |
| 2018/0090539 A1* | 3/2018 | Son | H01L 27/156 |

OTHER PUBLICATIONS

"Office Action of US Related Application, U.S. Appl. No. 15/255,161", dated Oct. 5, 2017, p. 1-p. 24.
"Office Action of US Related Application, U.S. Appl. No. 15/255,161," dated Aug. 7, 2018, pp. 1-17.

* cited by examiner

MICRO LIGHT EMITTING DIODE AND MANUFACTURING METHOD THEREOF

CROSS-REFERENCE TO RELATED APPLICATION

The application claims the priority benefit of U.S. provisional application Ser. No. 62/376,890, filed on Aug. 18, 2016. The entirety of the above-mentioned patent application is hereby incorporated by reference herein and made a part of this specification.

BACKGROUND OF THE INVENTION

Field of the Invention

The invention relates to a light emitting diode (LED) and a manufacturing method thereof, and particularly relates to a micro LED (μLED) and a manufacturing method thereof.

Description of Related Art

Along with evolution of lighting technology, conventional incandescent bulbs and fluorescent lamps are gradually replaced by micro light emitting diodes (μLEDs) due to low luminous efficiency or environmental protection. The μLED has advantages of long service life, compact volume, high luminous efficiency and low power consumption, etc., so that it is widely used in various different applications.

In recent years, a technique of reducing the size of the conventional LED to micron scale is developed, and the size-reduced LED is referred to as a micro LED (μLED). When the μLEDs are used in the field of the display technique, each of the μLEDs may be taken as a sub-pixel in a display panel, and such display panel is referred to as a micro LED display panel. The μLED of each sub-pixel of the micro LED display panel may be controlled via addressing and individually driven to emit light, and has advantages of high brightness, low power consumption, high resolution, high color saturation, etc. Compared to an organic light emitting diode (OLED) display, the micro LED display panel further has an advantage of a long service life. Therefore, the micro LED display panel is regarded as a mainstream technique in the next generation for display.

However, a manufacturing process of the μLED often encounters following problems. For example, for a common flip-chip μLED, since two electrodes are respectively disposed on a mesa portion and a recess portion with different horizontal heights, when the μLED is bonded to an external substrate, it often causes a tilt phenomenon of the μLED and leads to a poor bonding yield. Moreover, since the size of the μLED is small relative to a conventional LED, the above-mentioned tilt phenomenon of the μLED is more severe. In order to resolve the tilt phenomenon, one solution is to dispose the two electrodes on two mesa portions with the same horizontal height, such that the surfaces of the two electrodes are devised to stand on the same horizontal plane. However, since such solution requires to etch a hole in the mesa configured for an N-type electrode, and form a protective layer on the surface of the hole to electrically isolate a P-type doped semiconductor layer and a light emitting layer from the mesa portion of the N-type electrode, and then etch a part of the protective layer to expose an underneath N-type doped semiconductor layer, so as to electrically connect the N-type electrode and the N-type doped semiconductor layer. However, since the hole is very tiny (below 10 μm×10 μm), the protective layer is hard to be formed in the hole, which makes the manufacturing process of the μLED become more difficult. Moreover, the existence of the protective layer also limits the size of the N-type electrode. Therefore, a yield of the μLED manufactured based on the existing manufacturing process is low, which limits the development of the μLED technology.

SUMMARY OF THE INVENTION

The invention is directed to a micro light emitting diode (μLED), which has a simple structure and good manufacturing yield.

The invention is directed to a manufacturing method for manufacturing the aforementioned μLED, which has a simpler manufacturing process and higher manufacturing yield.

An embodiment of the invention provides a μLED including an epitaxial stacked layer, a first electrode and a second electrode. The epitaxial stacked layer includes a first type doped semiconductor layer, a light emitting layer and a second type doped semiconductor layer. The light emitting layer is located between the first type doped semiconductor layer and the second type doped semiconductor layer. The first type doped semiconductor layer and the second type doped semiconductor layer are opposite in electrical property. The epitaxial stacked layer has a first mesa portion and a second mesa portion to form a first type conductive region and a second type conductive region respectively, and the first mesa portion and the second mesa portion are connected through the second type doped semiconductor layer. The first electrode is electrically connected to the epitaxial stacked layer, and is disposed on the first mesa portion. The second electrode is electrically connected to the epitaxial stacked layer, and is disposed on the second mesa portion. The second electrode contacts the first type doped semiconductor layer, the light emitting layer and the second type doped semiconductor layer located at the second mesa portion.

In an embodiment of the invention, the epitaxial stacked layer has a first recess portion and a second recess portion. The first recess portion defines the first mesa portion and the second mesa portion and exposes the second type doped semiconductor layer. The second mesa portion has the second recess portion. The second recess portion defines a first sub mesa portion and a second sub mesa portion in the second mesa portion. The second recess portion exposes the second type doped semiconductor layer, a part of the first type doped semiconductor layer and a part of the light emitting layer in the second mesa portion.

In an embodiment of the invention, the first electrode has a first surface exposed to the external. The second electrode has a second surface exposed to the external. At least a part of the first surface and at least a part of the second surface are located on a same horizontal plane.

In an embodiment of the invention, a part of the first type doped semiconductor layer, a part of the light emitting layer and a part of the second type doped semiconductor layer in the first mesa portion constitute a first diode. A part of the first type doped semiconductor layer, a part of the light emitting layer and a part of the second type doped semiconductor layer in the first sub mesa portion constitute a second diode. A part of the first type doped semiconductor layer, a part of the light emitting layer and a part of the second type doped semiconductor layer in the second sub mesa portion constitute a third diode. A positive terminal of the first diode is coupled to the first electrode, and a negative terminal of the first diode is coupled to a negative terminal of the second diode and a negative terminal of the second diode.

In an embodiment of the invention, the μLED further includes a current spreading layer. The first electrode or the second electrode is electrically connected to the epitaxial stacked layer through the current spreading layer.

In an embodiment of the invention, the first type doped semiconductor layer is one of a P-type doped semiconductor layer and an N-type doped semiconductor layer, and the second type doped semiconductor layer is the other one of the P-type doped semiconductor layer and the N-type doped semiconductor layer.

In an embodiment of the invention, the μLED further includes a substrate. The epitaxial stacked layer, the first electrode and the second electrode are disposed at a same side of the substrate.

In an embodiment of the invention, the μLED further includes an insulation layer. The insulation layer is disposed on a side surface of the epitaxial stacked layer and a part of a top surface of the epitaxial stacked layer, and exposes the first mesa portion and the second mesa portion.

In an embodiment of the invention, the second electrode covers a part of the insulation layer.

In an embodiment of the invention, the insulation layer is extended to a surface of the substrate from the side surface of the epitaxial stacked layer.

In an embodiment of the invention, the epitaxial stacked layer further includes an unintentionally doped semiconductor layer. The unintentionally doped semiconductor layer is located between the second type doped semiconductor layer and the substrate.

In an embodiment of the invention, the insulation layer and the first electrode have a first gap therebetween, and the insulation layer and the second electrode have a second gap therebetween.

In an embodiment of the invention, the substrate is a patterned substrate.

In an embodiment of the invention, the first electrode directly contacts the first type doped semiconductor layer on the first mesa portion.

In an embodiment of the invention, a diagonal length of the μLED is within a range of less than 100 μm.

An embodiment of the invention provides a manufacturing method of a μLED, which includes: providing a substrate; forming an epitaxial stacked layer on the substrate, where the epitaxial stacked layer includes a first type doped semiconductor layer, a light emitting layer and a second type doped semiconductor layer, the light emitting layer is located between the first type doped semiconductor layer and the second type doped semiconductor layer, and the first type doped semiconductor layer and the second type doped semiconductor layer are opposite in electrical property; etching the epitaxial stacked layer to make the epitaxial stacked layer have a first mesa portion and a second mesa portion for forming a first type conductive region and a second type conductive region respectively; forming a first electrode on the first mesa portion in the first type conductive region and forming a second electrode on the second mesa portion in the second type conductive region, respectively, where the first electrode and the second electrode are electrically connected to the epitaxial stacked layer, and the second electrode contacts the first type doped semiconductor layer, the light emitting layer and the second type doped semiconductor layer of the second mesa portion.

In an embodiment of the invention, the step of etching the epitaxial stacked layer includes the step of etching a part of the first type doped semiconductor layer, a part of the light emitting layer and a part of the second type doped semiconductor layer to make the epitaxial stacked layer have a first recess portion and a second recess portion. The first recess portion defines the first mesa portion and the second mesa portion to form the first type conductive region and the second type conductive region respectively, and the second recess portion defines a first sub mesa portion and a second sub mesa portion in the second mesa portion.

In an embodiment of the invention, the step of etching the epitaxial stacked layer to make the epitaxial stacked layer to have the first mesa portion and the second mesa portion includes: etching the epitaxial stacked layer to expose a part of the substrate.

In an embodiment of the invention, after the step of etching the epitaxial stacked layer to expose a part of the substrate, the manufacturing method further includes: forming an insulation layer on a side surface of the epitaxial stacked layer and a part of a top surface of the epitaxial stacked layer to expose the first mesa portion and the second mesa portion.

In an embodiment of the invention, before the step of forming the first electrode and the second electrode on the first mesa portion and the second mesa portion respectively, the manufacturing method further includes: forming a current spreading layer on the epitaxial stacked layer.

An embodiment of the invention provides a manufacturing method of μLEDs, which includes: providing a substrate; forming an epitaxial stacked layer on the substrate, where the epitaxial stacked layer includes a first type doped semiconductor layer, a light emitting layer and a second type doped semiconductor layer, the light emitting layer is located between the first type doped semiconductor layer and the second type doped semiconductor layer, and the first type doped semiconductor layer and the second type doped semiconductor layer are opposite in electrical property; etching the epitaxial stacked layer to make the epitaxial stacked layer to form a plurality of sub epitaxial stacked layers separated from each other and expose the part of the substrate, where each of the sub epitaxial stacked layers includes a part of the first type doped semiconductor layer, a part of the light emitting layer and a part of the second type doped semiconductor layer; etching each of the sub epitaxial stacked layers to make each of the sub epitaxial stacked layers have a first mesa portion and a second mesa portion to form a first type conductive region and a second type conductive region respectively; and forming a plurality of first electrodes on the first mesa portions in the first type conductive regions, and forming a plurality of second electrodes on the second mesa portions in the second type conductive regions, where each of the first electrodes is electrically connected to the corresponding sub epitaxial stacked layer, and each of the second electrodes is electrically connected to the corresponding sub epitaxial stacked layer, so as to form a plurality of μLEDs on the substrate. In each of the μLEDs, the second electrode contacts the first type doped semiconductor layer, the light emitting layer and the second type doped semiconductor layer of the corresponding second mesa portion, and the μLEDs are connected to each other through the substrate.

In an embodiment of the invention, the step of etching each of the sub epitaxial stacked layers further includes: etching a part of the first type doped semiconductor layer, a part of the light emitting layer and a part of the second type doped semiconductor layer in each of the sub epitaxial stacked layers to make each of the sub epitaxial stacked layers have a first recess portion and a second recess portion. The first recess portion defines the first mesa portion and the second mesa portion to form the first type conductive region and the second type conductive region respectively, and the second recess portion defines a first sub mesa portion and a second sub mesa portion in the second mesa portion.

In an embodiment of the invention, after the step of forming the μLEDs on the substrate, the manufacturing method further includes: providing a temporary substrate; selecting at least a part of the μLEDs on the substrate as a predetermined detaching portion, and detaching the μLEDs in the predetermined detaching portion from the substrate; and transferring the detached μLEDs in the predetermined detaching portion to the temporary substrate.

In an embodiment of the invention, any of the μLEDs in the predetermined detaching portion on the temporary substrate is a first μLED, where the first μLED is located adjacent to a second μLED of the μLEDs in a first direction, and the first μLED and the second μLED have a first gap there between. The first μLED is located adjacent to a third μLED of the μLEDs in a second direction different to the first direction, and the first μLED and the third μLED have a second gap there between.

In an embodiment of the invention, an area of an orthogonal projection of the first mesa portion is substantially the same to an area of an orthogonal projection of the second mesa portion.

According to the above descriptions, in the μLED of the invention, through the design of contacting the second electrode with the first type doped semiconductor layer, the light emitting layer and the second type doped semiconductor layer located on the second mesa portion, compared to the structure of the prior art where the protective layer is evaporated and etched in the hole, the μLED of the invention has a simple structure and a higher manufacturing yield, and the area of the second electrode is not limited. Moreover, the aforementioned μLED may be manufactured according to the manufacturing method of the μLED of the invention, so that the manufacturing method of the μLED of the invention has a simple manufacturing flow and higher manufacturing yield.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9A to FIG. 20A are top views of a manufacturing process of a μLED of according to another embodiment of the invention.

FIG. 9B to FIG. 20B are cross-sectional views of the manufacturing process of FIG. 9A to FIG. 20A.

FIG. 22A to FIG. 26A are top views of a manufacturing process of a μLED of according to still another embodiment of the invention.

FIG. 22B to FIG. 26B are cross-sectional views of the manufacturing process of FIG. 22A to FIG. 26A.

DESCRIPTION OF EMBODIMENTS

Figure 1A:
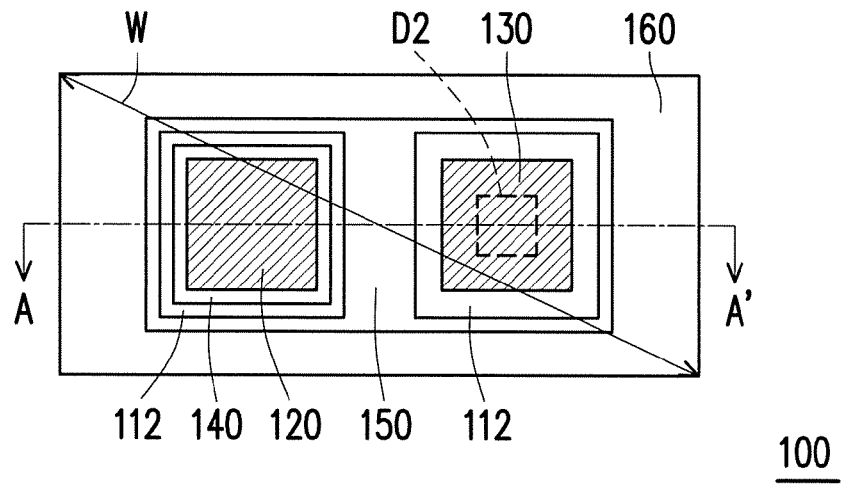
FIG. 1A is a top view of a micro light emitting diode (μLED) according to an embodiment of the invention.
Figure 1B:
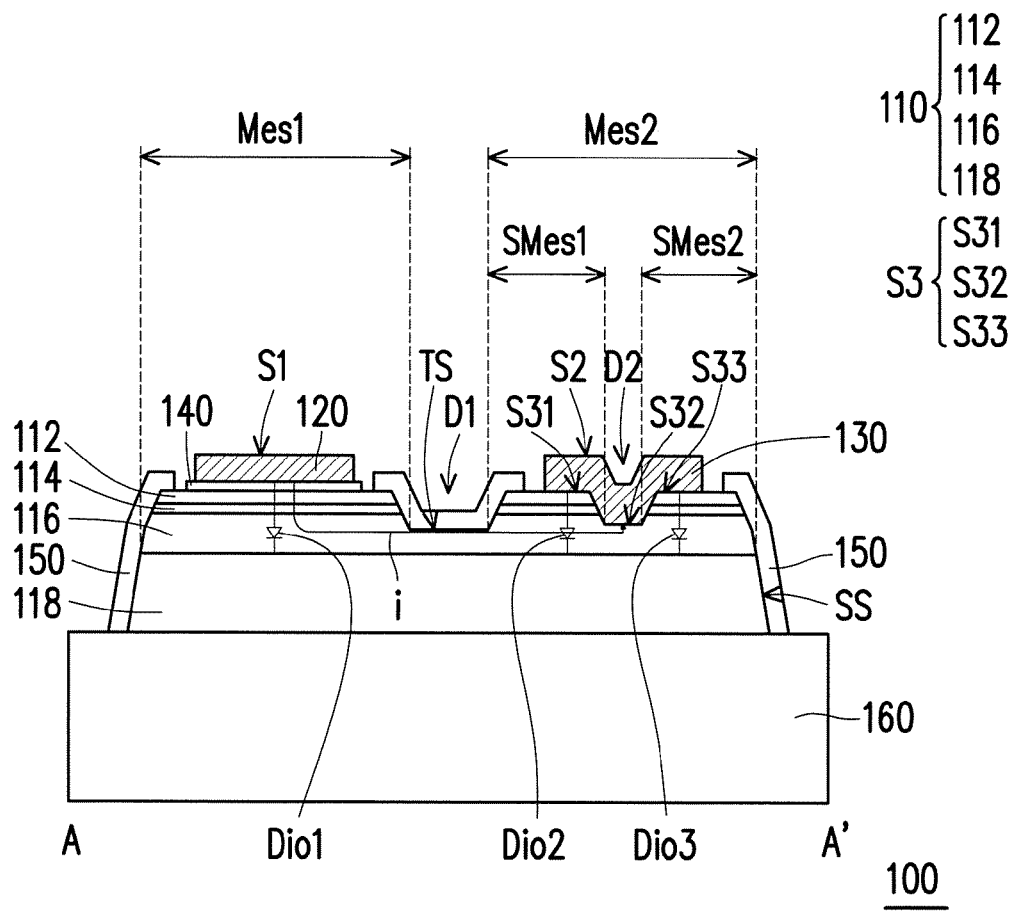
FIG. 1B is a cross-sectional view of FIG. 1A along a section line A-A.
Figure 1C:
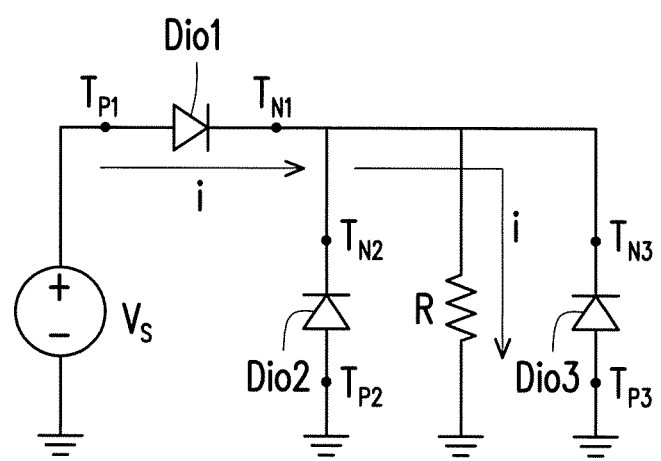
FIG. 1C is an equivalent circuit diagram of the μLED of FIG. 1A connected to an external power.

FIG. 1A is a top view of a micro light emitting diode (μLED) according to an embodiment of the invention. FIG. 1B is a cross-sectional view of FIG. 1A along a section line A-A. FIG. 1C is an equivalent circuit diagram of the μLED of FIG. 1A connected to an external power.

Referring to FIG. 1A, in the present embodiment, the μLED 100 is, for example, a flip-chip μLED. A size of the μLED 100 is, for example, in a micro-scale. In detail, a length of a diagonal W of the μLED 100, for example, ranges between 1 micrometer (μm) and 100 preferably, the length of the diagonal W of the μLED 100 ranges between 10 μm and 50 μm. Referring to FIG. 1B, the μLED 100 includes an epitaxial stacked layer 110, a first electrode 120, a second electrode 120, a current spreading layer 140, an insulation layer 150 and a substrate 160, and functions of the above components are described in detail below.

In the present embodiment, the epitaxial stacked layer 110 includes a first type doped semiconductor layer 112, a light emitting layer 114, a second type doped semiconductor layer 116 and an unintentionally doped semiconductor layer 118. The light emitting layer 114 is located between the first type doped semiconductor layer 112 and the second type doped semiconductor layer 116. The first type doped semiconductor layer 112, the light emitting layer 114 and the second type doped semiconductor layer 116 are stacked on the unintentionally doped semiconductor layer 118. In detail, the epitaxial stacked layer 110 has a first mesa portion Mes1 and a second mesa portion Mes2, and the epitaxial stacked layer 110 has a first recess portion D1 and a second recess portion D2. The first recess portion D1 defines the first mesa portion Mes1 and the second mesa portion Mes2 to form a first type conductive region and a second type conductive region respectively. The first mesa portion Mes1 and the second mesa portion Mes2 are connected to each other through the second type doped semiconductor layer 116 in the epitaxial stacked layer 110. The second mesa portion Mes2 has the second recess portion D2, and the second recess portion D2 defines a first sub mesa portion SMes1 and a second sub mesa portion SMes2. Moreover, the second recess portion D2 exposes the second type doped semiconductor layer 116 in the second mesa portion Mes2. In the present embodiment, the first mesa portion Mes1, the first sub mesa portion SMes1 and the second sub mesa portion SMes2 all have a part of the first type doped semiconductor layer 112, a part of the light emitting layer 114 and a part of the second type doped semiconductor layer 116.

In the present embodiment, the first type doped semiconductor layer 112 is different to the second type doped semiconductor layer 116. To be specific, the first type doped semiconductor layer 112 and the second type doped semiconductor layer 116 are opposite in electrical property. The first type doped semiconductor layer 112 is one of a P-type doped semiconductor layer and an N-type doped semiconductor layer, for example, the P-type doped semiconductor layer, where a material of the P-type doped semiconductor layer is, for example, p-GaN. The second type doped semiconductor layer 116 is the other one of the P-type doped semiconductor layer and the N-type doped semiconductor layer, for example, the N-type doped semiconductor layer, where a material of the N-type doped semiconductor layer is, for example, n-GaN. The light emitting layer 114 is, for example, a multiple quantum well (MQW) comprising alternately stacking multi-layer of well layers and multi-layer of barrier layers or a recombination area for the recombination of holes of the first type doped semiconductor layer 112 and electrons of the second type doped semiconductor layer 116. In the present embodiment, the well layer in the MQW is, for example, InGaN, and the barrier layer in the MQW is, for example, GaN. Since the well layer has a lower energy band gap compared with that of the barrier layer, the barrier layer may limit the electrons and the holes to recombine in the well layer to emit photons. In other embodiments, the light emitting layer 114 is, for example, a single quantum well (SQW), which is not limited by the invention. Moreover, a material of the unintentionally doped semiconductor layer 118 is, for example, unintentionally doped u-GaN, which is not limited by the invention. In overall, the epitaxial stacked layer 110 of the present embodiment is, for example, a semiconductor structure of nitride. In other embodiments, the material of the unintentionally doped semiconductor layer 118 is, for example, AlN.

In the present embodiment, the first electrode 120 is electrically connected to the epitaxial stacked layer 110, and is disposed on the first mesa portion Mes1 of the epitaxial stacked layer 110. The first electrode 120 has a first surface S1 exposed to external. The first electrode 120 is, for example, a P-type electrode. The first electrode 120 is, for example, a metal electrode, and a material thereof is, for example, Au, Ni, Pt, Sn, Al, Ti, Al/Cu alloy, Sn/Ag/Cu alloy, Au/Sn alloy, Sn alloy or alloys thereof, which is not limited by the invention.

In the present embodiment, the second electrode 130 is electrically connected to the epitaxial stacked layer 110, and is disposed on the second mesa portion Mes2 of the epitaxial stacked layer 110. The second electrode 130 is, for example, an N-type electrode. The second electrode 130 has a second surface S2 exposed to external and a third surface S3 opposite to the second surface S2. The second electrode 130 directly contacts the first type doped semiconductor layer 112, the light emitting layer 114 and the second type doped semiconductor layer 116 located on the second mesa portion Mes2 through the third surface S3. In detail, the third surface S3 is divided into three portions including a first portion S21, a second portion S32 and a third portion S33. The second electrode 130 directly contacts the first type doped semiconductor layer 112, the light emitting layer 114 and a part of the second type doped semiconductor layer 116 located on the first sub mesa portion SMes1 through the first portion S31 of the third surface S3. The second electrode 130 directly contacts the second type doped semiconductor layer 116 located on the second mesa portion Mes2 and exposed by the second recess portion D2 through the second portion S32 of the third surface S3. The second electrode 130 directly contacts the first type doped semiconductor layer 112, the light emitting layer 114 and a part of the second type doped semiconductor layer 116 located on the second sub mesa portion SMes2 through the third portion S33 of the third surface S3. The second electrode 130 is, for example, a metal electrode, and a material thereof is, for example, Au, Ni, Pt, Sn, Al, Ti, Al/Cu alloy, Sn/Ag/Cu alloy, Au/Sn alloy, Sn alloy or alloys thereof, which is not limited by the invention.

Referring to FIG. 1B, in the present embodiment, at least a part of the first surface S1 of the first electrode 120 and at least a part of the second surface S2 of the second electrode 130 are in a same horizontal plane. In other words, at least a part of the first surface S1 and at least a part of the second surface S2 are substantially aligned. Therefore, when the μLED 100 of the present embodiment is bonded to an external substrate (for example, a thin-film transistor substrate in a display panel), it is not liable to encounter a tilt problem, and through the aforementioned design, the manufacturing yield is further improved. In an embodiment of the invention, the metal electrodes of the first electrode 120 and the second electrode 130 include a material of tin, such that when the μLED 100 of the present embodiment is bonded to the external substrate (for example, the thin-film transistor substrate in the display panel), the μLED 100 may be directly and electrically bonded to a circuit on the external substrate, or a circuit metal electrode on the external substrate includes a material of tin, such that when the μLED 100 of the present embodiment is bonded to the external substrate (for example, the thin-film transistor substrate in the display panel), the μLED 100 may be directly and electrically bonded to the circuit on the external substrate. Through the above design, usage of extra solder material consumed in bonding of the μLED 100 and the external substrate is decreased.

In the present embodiment, the current spreading layer 140 is disposed between the first electrode 120 and the first mesa portion Mes1. The first electrode 120 is electrically connected to the epitaxial stacked layer 110 through the current spreading layer 140. A material of the current spreading layer 140 is, for example, indium tin oxide (ITO) or indium zinc oxide (IZO) or a transparent conductive material such as a transparent metal layer, etc., or a metal material having a reflecting function such as Au, Ni, Pt, Sn, Al, Ti, W/Au alloy, Al/Cu alloy, Sn/Ag/Cu alloy, Sn alloy or alloys thereof, which is not limited by the invention.

In the present embodiment, the insulation layer 150 is disposed on a side surface SS of the epitaxial stacked layer 110 and a part of a top surface TS of the epitaxial stacked layer 110 to expose the first mesa portion Mes1 and the second mesa portion Mes2. The insulation layer 150 and the first electrode 120, the second electrode 130 have gaps therebetween. A material of the insulation layer 150 is, for example, an insulation material or a combination of two stacked materials with different refractive indexes, which has a protection or reflection function, so that the insulation layer 150 is also regarded as a protective layer. The insulation layer 150 is, for example, made of $SiO_2$, or $Si_3N_4$ or $TiO_2$, which is not limited by the invention.

In the present embodiment, the substrate 160 is, for example, a sapphire substrate (Al$_2$O$_3$). In other embodiments, the substrate 160 may be a silicon substrate, a silicon carbide substrate (SiC) or other substrate suitable for growing the epitaxial stacked layer 110. The epitaxial stacked layer 110, the first electrode 120 and the second electrode 130 are disposed at a same side of the substrate 160. To be specific, the unintentionally doped semiconductor layer 118, the second type doped semiconductor layer 116, the light emitting layer 114 and the first type doped semiconductor layer 112 of the epitaxial stacked layer 110 are sequentially stacked on the substrate 160.

Referring to FIG. 1B and FIG. 1C, in the present embodiment, since the first type doped semiconductor layer 112 and the second type doped semiconductor layer 116 are opposite in electrical property, a part of the first type doped semiconductor layer 112, a part of the light emitting layer 114 and a part of the second type doped semiconductor layer 116 in the first mesa portion Mes1 may be regarded as a first diode Dio1. A part of the first type doped semiconductor layer 112, a part of the light emitting layer 114 and a part of the second type doped semiconductor layer 116 in the first sub mesa portion SMes1 may be regarded as a second diode Dio2. A part of the first type doped semiconductor layer 112, a part of the light emitting layer 114 and a part of the second type doped semiconductor layer 116 in the second sub mesa portion SMes2 may be regarded as a third diode Dio3. The μLED 100 of the present embodiment is equivalent to be connected to an external power Vs (shown in FIG. 1C), and a positive electrode of the external power Vs is coupled to the first electrode 120 of the μLED 100. A positive terminal $T_{p1}$ of the first diode Dio1 is coupled to the first electrode 120, and a negative terminal $T_{N1}$ of the first diode Dio1 is coupled to a negative terminal $T_{N2}$ of the second diode Dio2 and a negative terminal $T_{N3}$ of the third diode Dio3. A negative electrode of the external power Vs, a positive terminal $T_{P2}$ of the second diode Dio2 and a positive terminal $T_{P3}$ of the third diode are regarded to be grounded. A resistance of the components in the μLED 100 may be equivalent to a resistance R.

Referring to FIG. 1B and FIG. 1C, when the external power Vs supplies a current i to the μLED 100, since the current i is a forward bias for the first diode Dio1 of the first mesa portion Mes1, and the current i is a reverse bias for the second diode Dio2 of the first sub mesa portion SMes1 and the third diode Dio3 of the second sub mesa portion SMes2, the current i is not liable to flow to the second electrode 130 from the top surfaces of the first sub mesa portion SMes1 and the second sub mesa portion SMes2. In detail, the current i sequentially passes through the first electrode 120, the current spreading layer 140, the first type doped semiconductor layer 112 (i.e. the P-type doped semiconductor layer 112), the light emitting layer 114, the second type doped semiconductor layer 116 (i.e. the N-type doped semiconductor layer 116), and then enters the second electrode 130 through the second portion S32 of the third surface S3 of the second electrode 130 (i.e. the part of surface of the second electrode 130 that directly contacts the second type doped semiconductor layer 116), and then the current i leaves the μLED 100 from the second electrode 130. In other words, the portion of the second electrode 130 that contacts the first type doped semiconductor layer 112 on the second mesa portion Mes2 (i.e. the first sub mesa portion SMes1 and the second sub mesa portion SMes2) has a current barrier function, and the portion of the second electrode 130 that contacts the second type doped semiconductor layer 116 on the second mesa portion Mes2 has a current conducting function.

According to the above description, in the μLED 100 of the present embodiment, through the design of contacting the second electrode 130 with the first type doped semiconductor layer 112, the light emitting layer 114 and the second type doped semiconductor layer 116 located at the second mesa portion Mes2, compared to the structure of the prior art where the protective layer is evaporated and etched in the hole, the μLED of the invention has a simple structure and a higher manufacturing yield, and an area of the second electrode 130 is not limited.

FIG. 2A to FIG. 2K are flowcharts illustrating a process for manufacturing the μLED of the embodiment of FIG. 1A and FIG. 1B. The method for manufacturing the μLED 100 of the invention is described in detail below.

Figure 2A:
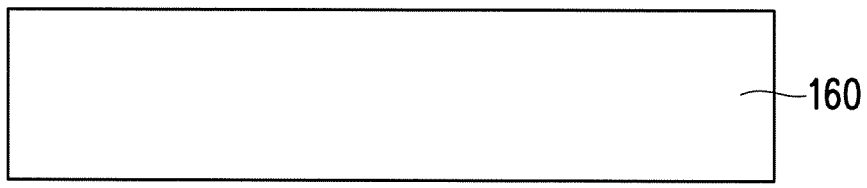
FIG. 2A to FIG. 2K are flowcharts illustrating a process for manufacturing the μLED of the embodiment of FIG. 1A and FIG. 1B.

Referring to FIG. 2A, the substrate 160 is provided. The substrate 160 is, for example, a growth substrate used for growing the epitaxial stacked layer 110.

Figure 2B:
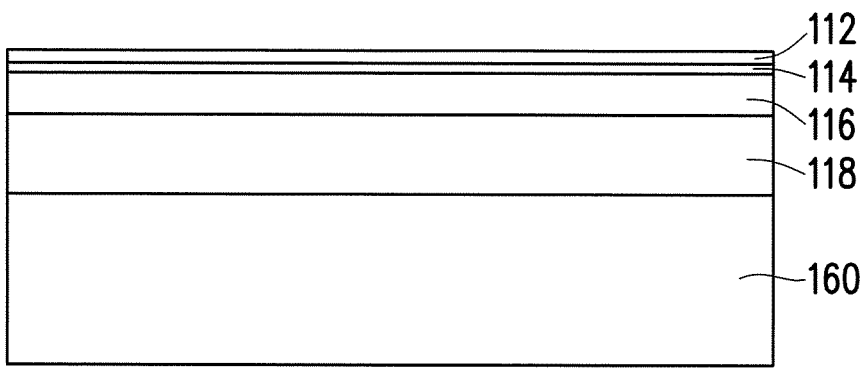

Referring to FIG. 2B, the epitaxial stacked layer 110 is formed on the substrate 160, where the epitaxial stacked layer 110 includes the first type doped semiconductor layer 112, the light emitting layer 114, the second type doped semiconductor layer 116 and the unintentionally doped semiconductor layer 118 (a function thereof is to serve as a low temperature nucleation layer or a buffer layer, and a main component thereof is GaN or AlN) or a buffer layer formed by a non-epitaxial growing process, for example, GaN, AlN, SiC or a combination thereof including a carbon material or a carbon covalent bond. The light emitting layer 114 is located between the first type doped semiconductor layer 112 and the second type doped semiconductor layer 116. The first type doped semiconductor layer 112 and the second type doped semiconductor layer 116 are opposite in electrical property. In detail, the unintentionally doped semiconductor layer 118 is first formed on the substrate 160. Then, the second type doped semiconductor layer 116 is formed on the unintentionally doped semiconductor layer 118. Then, the light emitting layer 114 is formed on the second type doped semiconductor layer 116. Finally, the first type doped semiconductor layer 112 is formed on the light emitting layer 114. The aforementioned method for growing the epitaxial stacked layer 110 is, for example, a metal organic chemical vapor deposition (MOCVD) method, though the invention is not limited thereto.

Figure 2C:
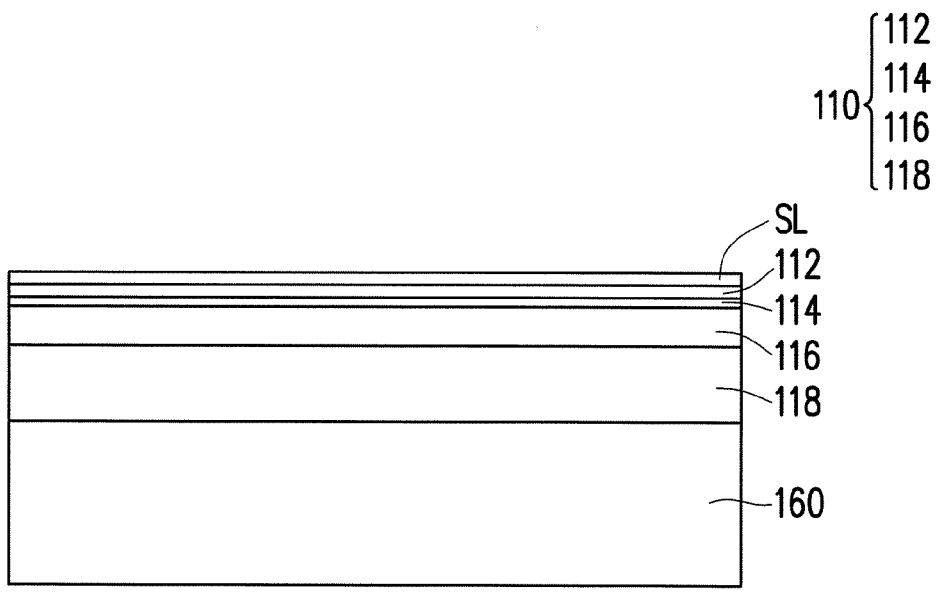

Referring to FIG. 2C, a sacrificial layer SL is formed on the epitaxial stacked layer 110. A material of the sacrificial layer SL is, for example, SiO$_2$, TiO$_2$ or a combination of two stacked materials with different refractive indexes, which is not limited by the invention.

Figure 2D:
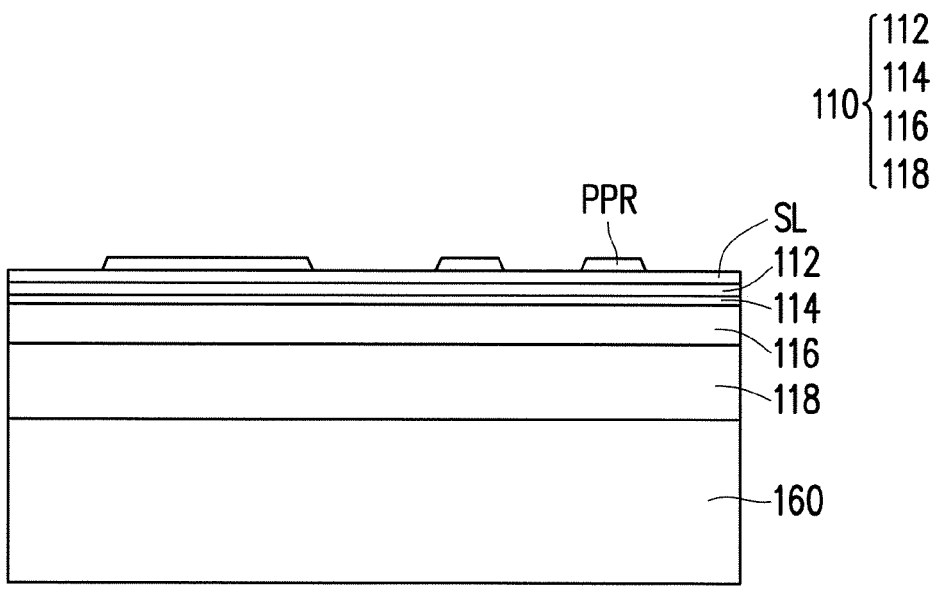

Referring to FIG. 2D, a patterned photoresist layer PPR is formed on the sacrificial layer SL.

Figure 2E:
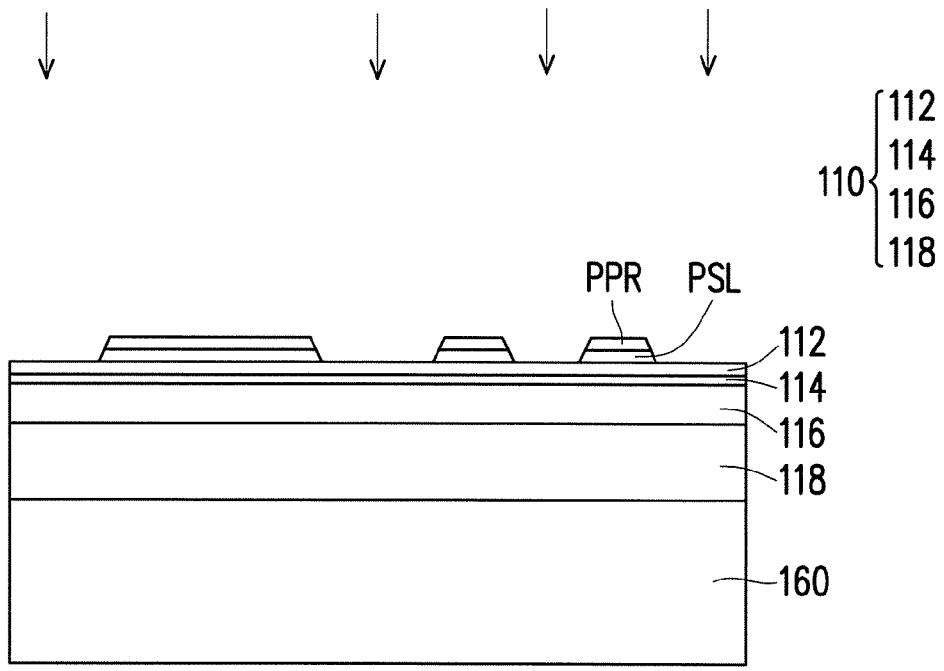

Referring to FIG. 2E, a part of the sacrificial layer SL is etched. The sacrificial layer SL is, for example, etched through dry chemical etching, wet chemical etching, physical etching or a combination thereof to transfer a pattern of the patterned photoresist layer PPR to the sacrificial layer SL to form a patterned sacrificial layer PSL and expose a part of the epitaxial stacked layer 110.

Figure 2F:
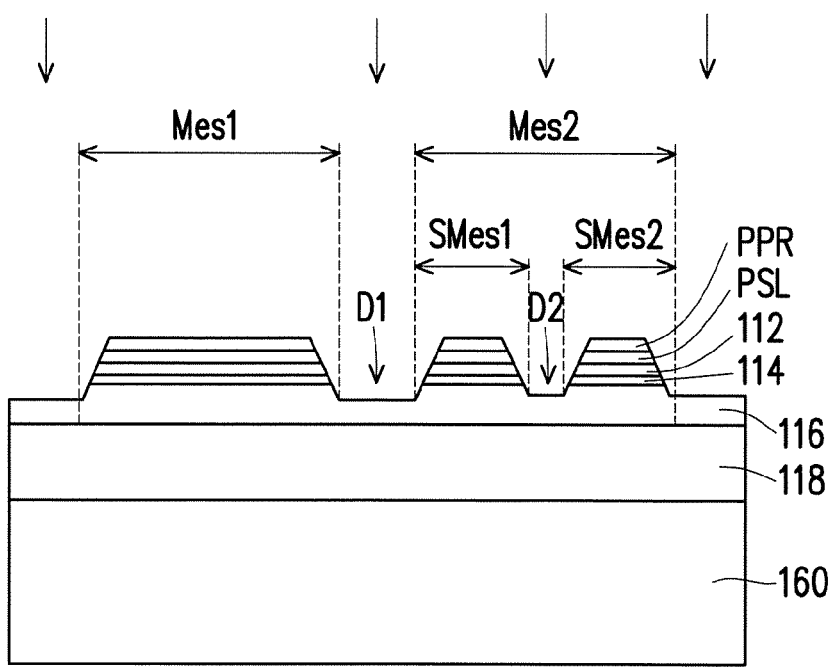

Referring to FIG. 2F, the epitaxial stacked layer 110 is etched to expose a part of the second type doped semiconductor layer 116 to form the first recess portion D1 and the second recess portion D2. To be specific, a part of the first type doped semiconductor layer 112, a part of the light emitting layer 114 and a part of the second type doped semiconductor layer 116 are etched to form the first mesa portion Mes1 and the second mesa portion Mes2 of the epitaxial stacked layer 110, and the second mesa portion Mes2 further has the first sub mesa portion SMes1 and the second sub mesa portion SMes2, where the patterned sacrificial layer PSL and the patterned photoresist layer PPR serve as a barrier layer of etching. In detail, in the etching process of FIG. 2F, the first recess portion D1 is formed to define the first mesa portion Mes1 and the second mesa portion Mes2, and the second recess portion D2 is formed to define the first sub mesa portion SMes1 and the second sub mesa portion SMes2 of the second mesa portion Mes2. In the etching process, the pattern of the patterned sacrificial layer PSL and the patterned photoresist layer PPR may be transferred to define a pattern of the first mesa portion Mes1 and the second mesa portion Mes2. In the present embodiment, the etching process is implemented through the dry chemical etching or the physical etching, and only the patterned sacrificial layer PSL may be taken as the barrier layer of etching to define the first mesa portion Mes1 and the second mesa portion Mes2, and the second recess portion D2 is formed to define the first sub mesa portion SMes1 and the second sub mesa portion SMes2 of the second mesa portion Mes2, though the invention is not limited thereto.

Figure 2G:
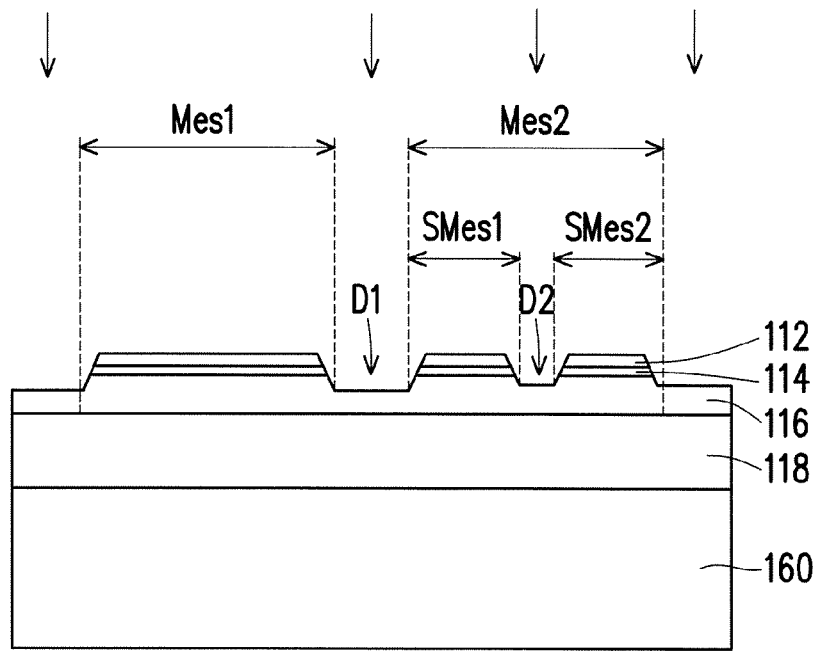

Referring to FIG. 2G, the patterned photoresist layer PPR and the patterned sacrificial layer PSL are removed to expose the first mesa portion Mes1 and the second mesa portion Mes2.

Figure 2H:
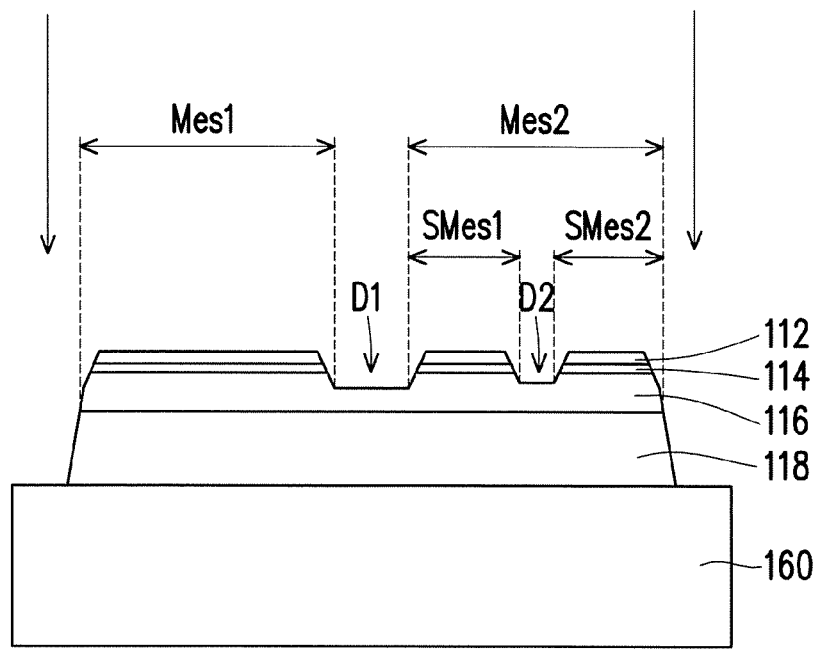

Referring to FIG. 2H, a part of the first type doped semiconductor layer 112, a part of the light emitting layer 114, a part of the second type doped semiconductor layer 116 and a part of the unintentionally doped semiconductor layer 118 are etched to expose a part of the substrate 160. In detail, in the manufacturing method of FIG. 2H, referring to the process of FIG. 2F, a patterned sacrificial layer and a patterned photoresist layer or a patterned sacrificial layer is taken as a barrier layer of etching to form a part of the first type doped semiconductor layer 112, a part of the light emitting layer 114, a part of the second type doped semiconductor layer 116 and a part of the unintentionally doped semiconductor layer 118 and expose a part of the substrate 160.

Figure 2I:
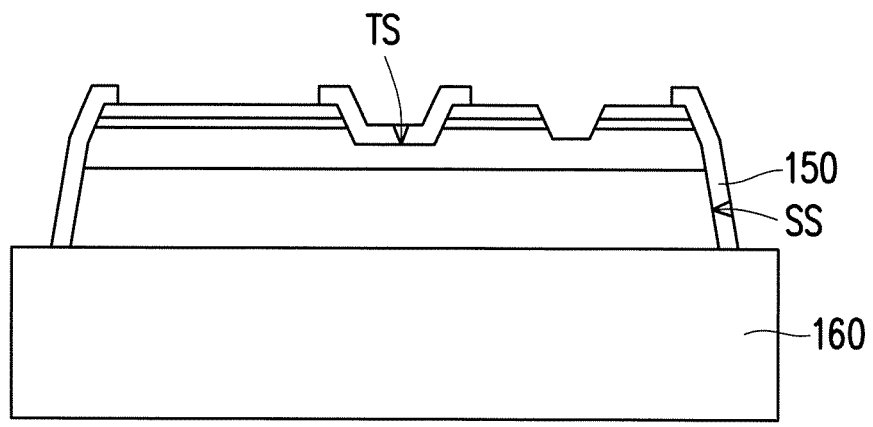

Referring to FIG. 2I, the insulation layer 150 is formed on the side surface SS of the epitaxial stacked layer 110 and a part of the top surface TS of the epitaxial stacked layer 110 to expose the first mesa portion Mes1 and the second mesa portion Mes2. The method for forming the insulation layer 150 is, for example, plasma-enhanced chemical vapour deposition (PECVD) or E-gun evaporation or alternatively, a photolithography photoresist lift-off or an etching manner is used, wherein an insulation layer is formed on the patterned photoresist layer and the epitaxial stacked layer 110 through the PECVD or the E-gun evaporation, and then the patterned photoresist layer is removed through photoresist lift-off, so as to form the insulation layer 150 on the epitaxial stacked layer 110 and a part of the substrate 160, however, the invention is not limited thereto.

Figure 2J:
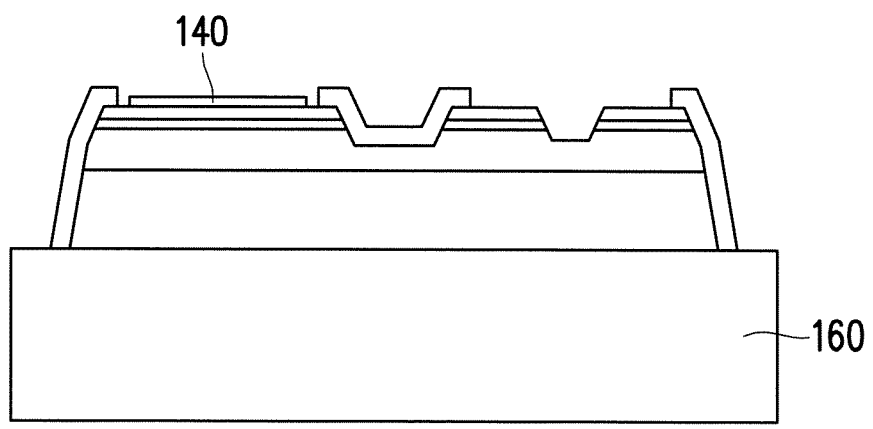

Referring to FIG. 2J, the current spreading layer 140 is formed on the first mesa portion Mes1, where the current spreading layer 140 contacts the first type doped semiconductor layer 112 located at the first mesa portion Mes1. The current spreading layer 140 is, for example, formed through E-gun evaporation or sputtering. In detail, a method for forming the current spreading layer 140 is to form the patterned photoresist layer on the epitaxial stacked layer 110 by using a photolithography photoresist lift-off or an etching manner, patterned photoresist layer is formed on the epitaxial stacked layer 110 and then a conductive layer for the current spreading layer 140 is formed on the patterned photoresist layer and the epitaxial stacked layer 110 through the PECVD or the E-gun evaporation, and then the patterned photoresist layer is removed through photoresist lift-off, so as to form the current spreading layer 140 on the epitaxial stacked layer 110.

Figure 2K:
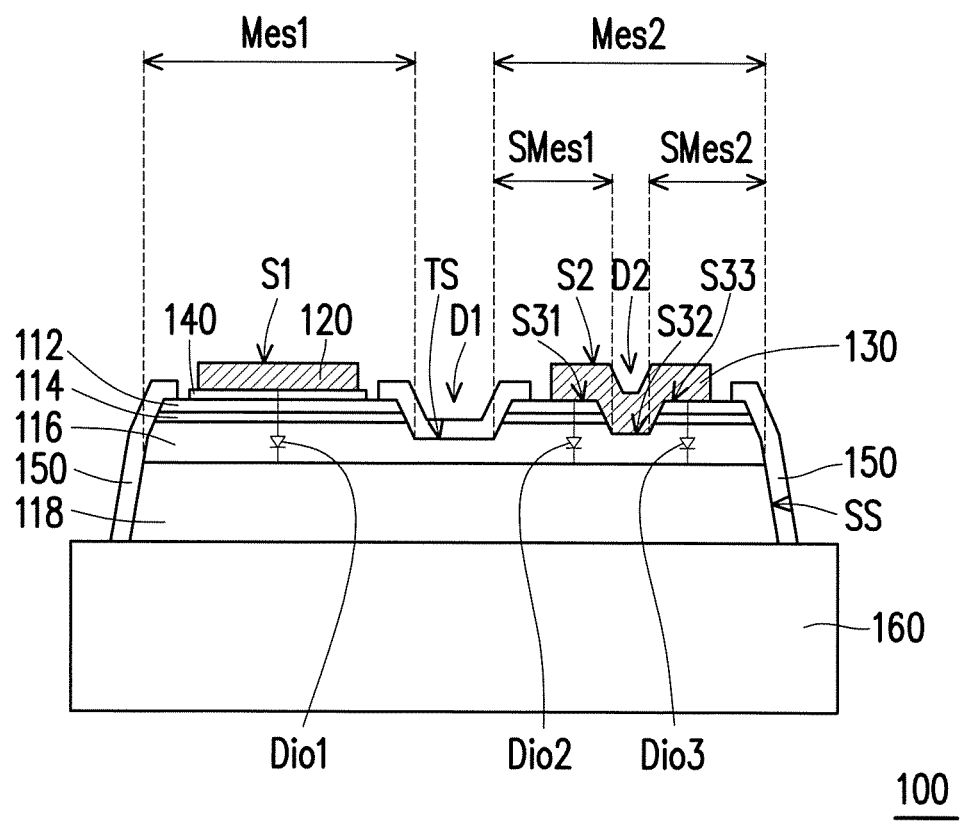

Referring to FIG. 2K, the first electrode 120 and the second electrode 130 are formed on the first mesa portion Mes1 and the second mesa portion Mes2, respectively. The first electrode 120 and the second electrode 130 are electrically connected to the epitaxial stacked layer 110. Till now, manufacturing of the μLED 100 of the embodiment of FIG. 1A and FIG. 1B is substantially completed.

It should be noticed that reference numbers of the components and a part of contents of the aforementioned embodiment are also used in the following embodiment, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 3A:
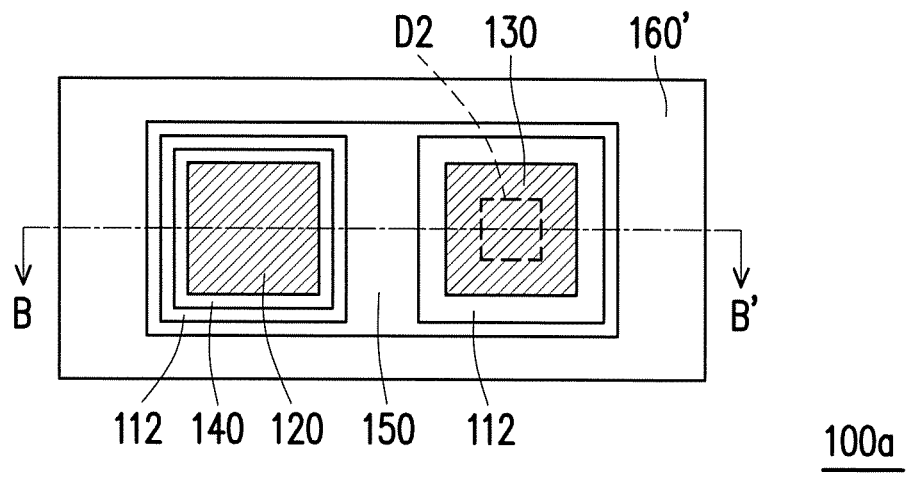
FIG. 3A is a top view of a μLED according to another embodiment of the invention.
Figure 3B:
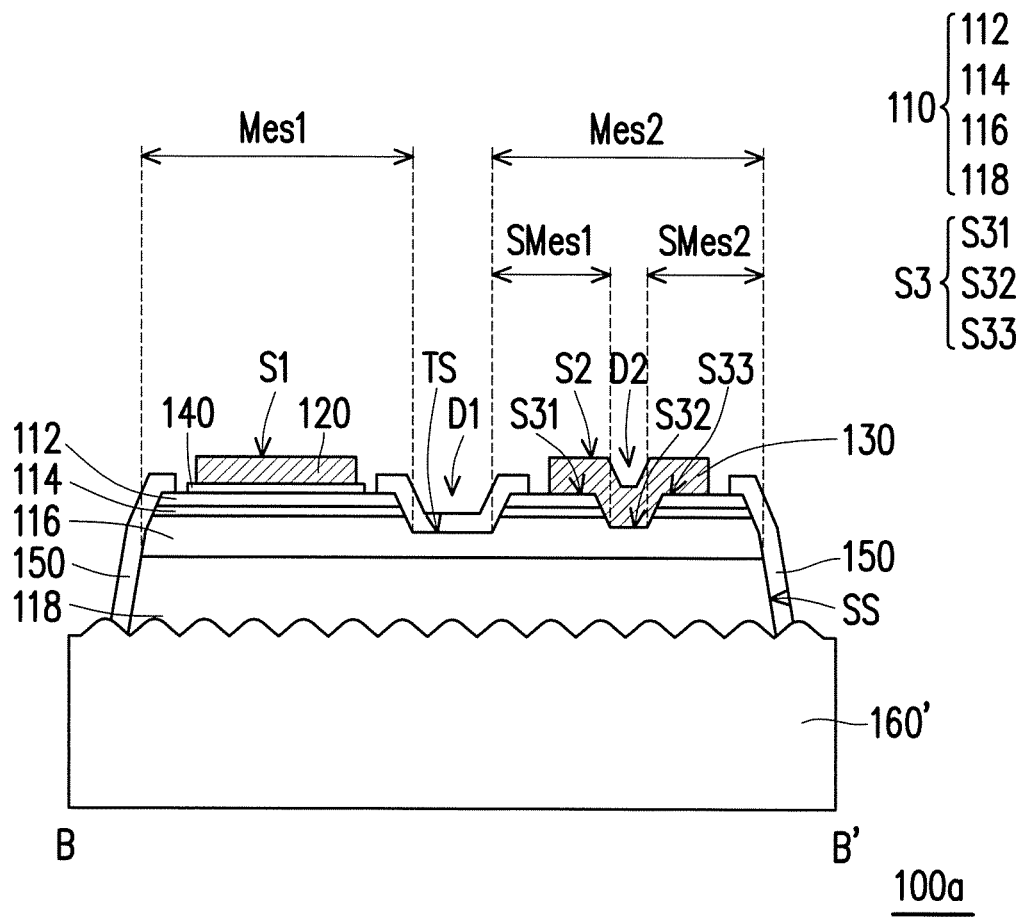
FIG. 3B is a cross-sectional view of FIG. 3A viewing along a section line B-B.

FIG. 3A is a top view of a μLED according to another embodiment of the invention. FIG. 3B is a cross-sectional view of FIG. 3A viewing along a section line B-B.

Referring to FIG. 3A and FIG. 3B, the μLED 100a of the embodiment of FIG. 3A and FIG. 3B is substantially similar to the μLED 100 of the embodiment of FIG. 1A and FIG. 1B, and a main difference there between is that in the present embodiment, the substrate 160' of the μLED 100a is, for example, a patterned substrate 160', and is, for example, a patterned sapphire substrate (PSS).

Figure 4A:
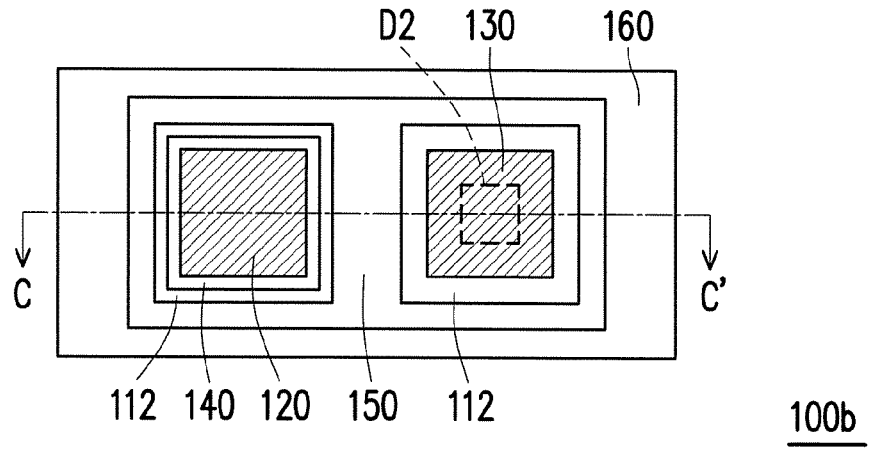
FIG. 4A is a top view of a μLED according to still another embodiment of the invention.
Figure 4B:
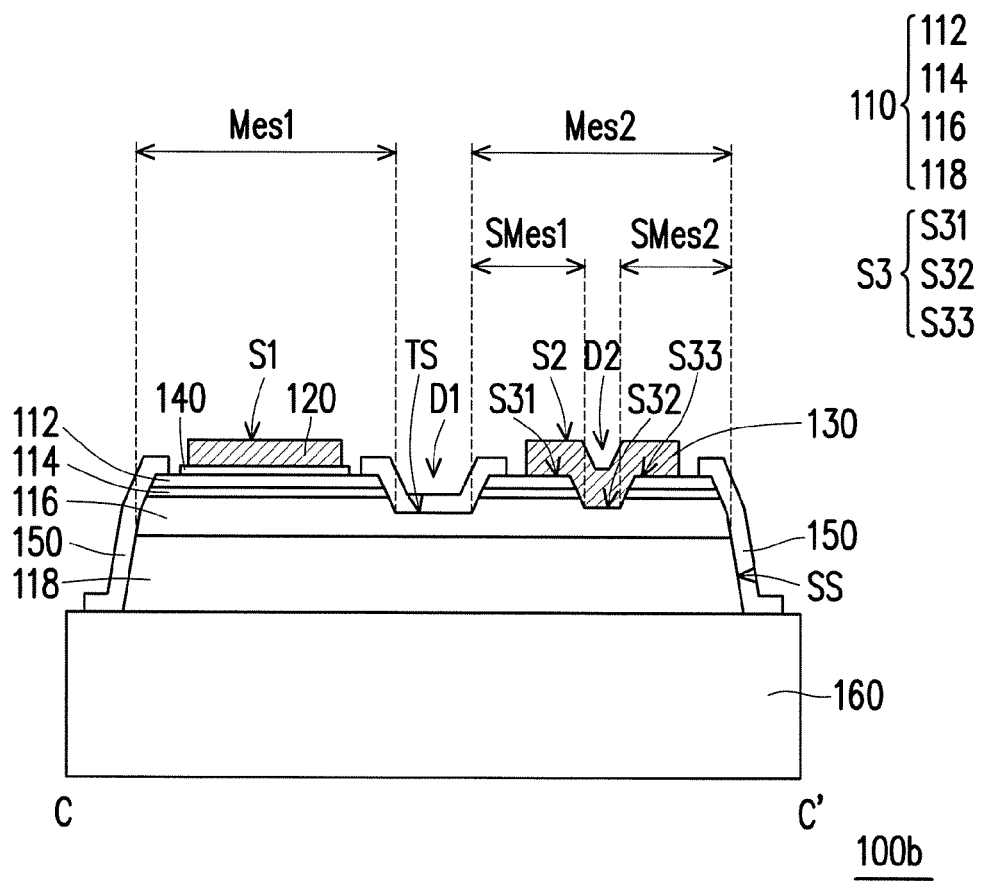
FIG. 4B is a cross-sectional view of FIG. 4A viewing along a section line C-C.

FIG. 4A is a top view of a μLED according to still another embodiment of the invention. FIG. 4B is a cross-sectional view of FIG. 4A viewing along a section line C-C.

Referring to FIG. 4A and FIG. 4B, the μLED 100b of the embodiment of FIG. 4A and FIG. 4B is substantially similar to the μLED 100 of the embodiment of FIG. 1A and FIG. 1B, and a main difference there between is that in the present embodiment, the insulation layer 150 of the μLED 100b further extends to the surface of the substrate 160 from the side surface SS of the epitaxial stacked layer 110. In other words, the insulation layer 150 covers partial surface of the substrate 160.

Figure 5A:
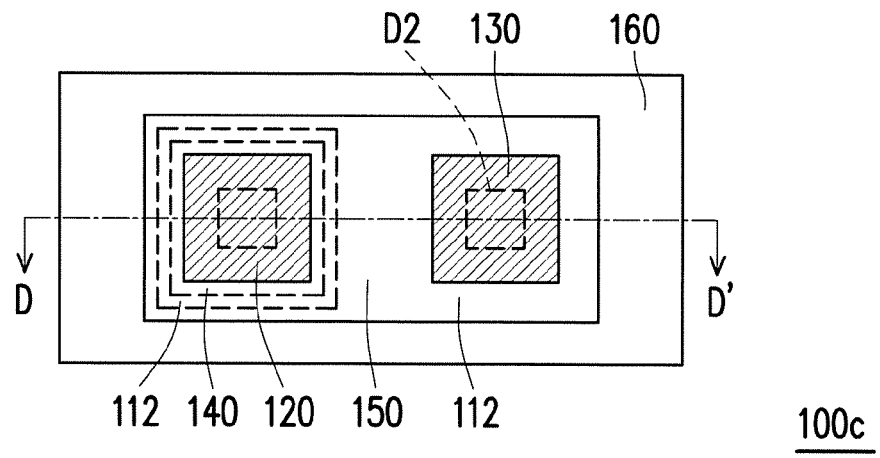
FIG. 5A is a top view of a μLED according to still another embodiment of the invention.
Figure 5B:
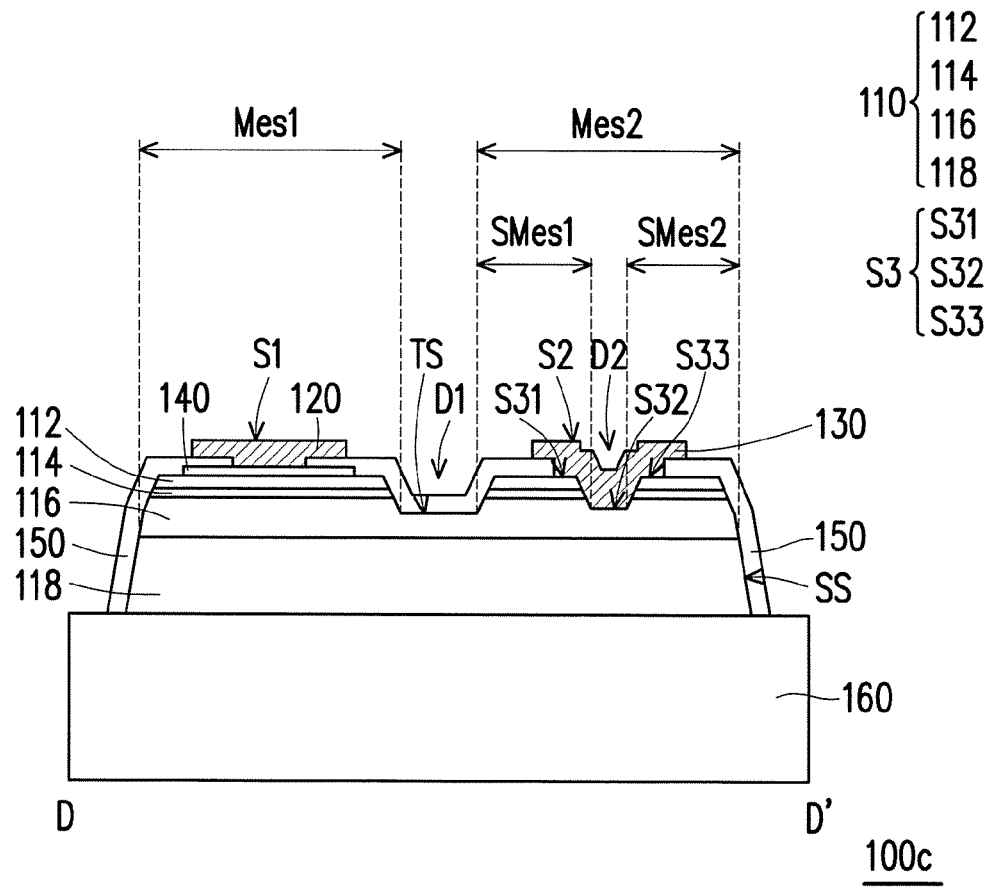
FIG. 5B is a cross-sectional view of FIG. 5A viewing along a section line D-D.

FIG. 5A is a top view of a μLED according to still another embodiment of the invention. FIG. 5B is a cross-sectional view of FIG. 5A viewing along a section line D-D.

Referring to FIG. 5A and FIG. 5B, the μLED 100c of the embodiment of FIG. 5A and FIG. 5B is substantially similar to the μLED 100 of the embodiment of FIG. 1A and FIG. 1B, and a main difference there between is that in the present embodiment, the first electrode 120 and the second electrode 130 of the μLED 100c respectively cover a part of the insulation layer 150. In other words, a part of the insulation layer 150 is disposed between the first electrode 120 and the epitaxial stacked layer 110 and between the second electrode 130 and the epitaxial stacked layer 110.

Figure 6A:
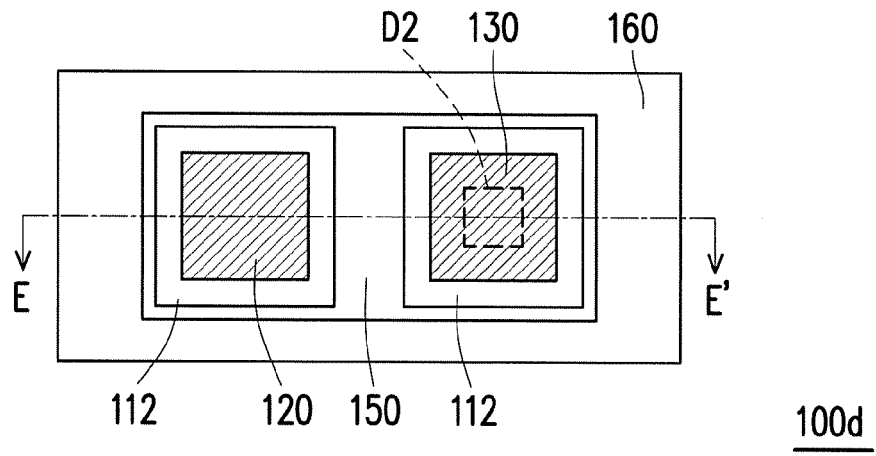
FIG. 6A is a top view of a μLED according to still another embodiment of the invention.
Figure 6B:
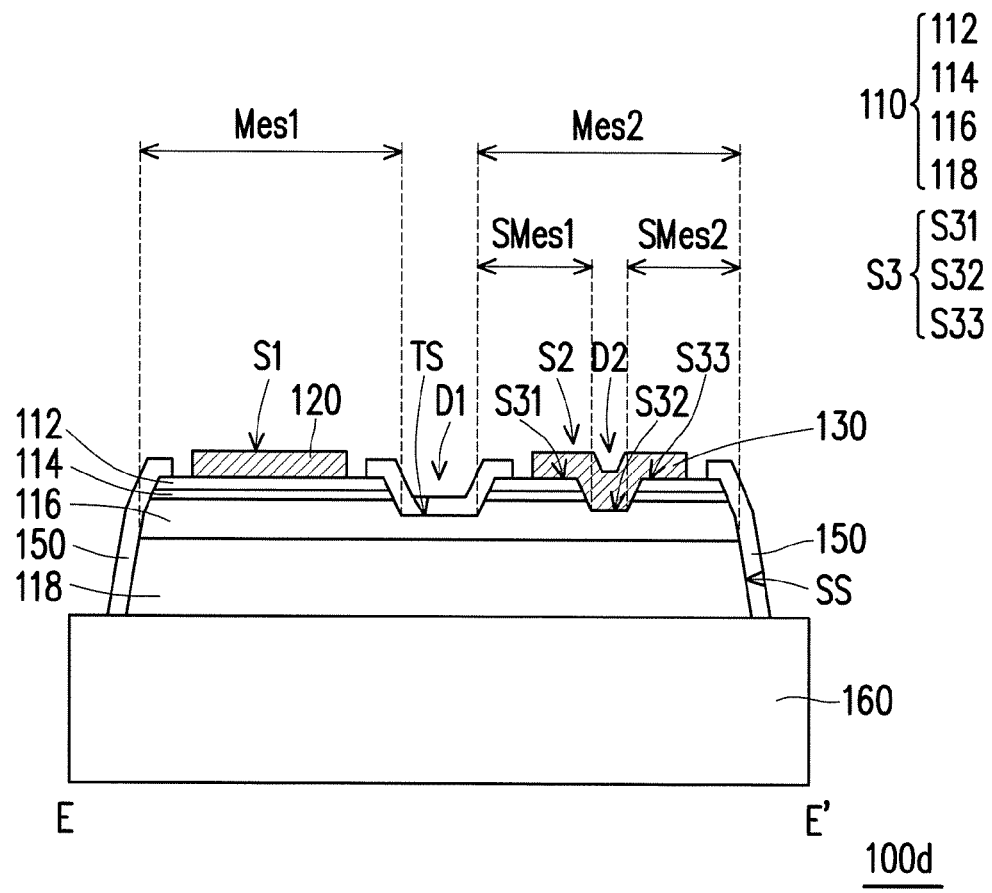
FIG. 6B is a cross-sectional view of FIG. 6A viewing along a section line E-E.

FIG. 6A is a top view of a μLED according to still another embodiment of the invention. FIG. 6B is a cross-sectional view of FIG. 6A viewing along a section line E-E.

Referring to FIG. 6A and FIG. 6B, the μLED 100d of the embodiment of FIG. 6A and FIG. 6B is substantially similar to the μLED 100 of the embodiment of FIG. 1A and FIG. 1B, and a main difference there between is that in the present embodiment, the first electrode 120 of the μLED 100d directly contacts the first type doped semiconductor layer 122 of the first mesa portion Mes1.

Figure 7A:
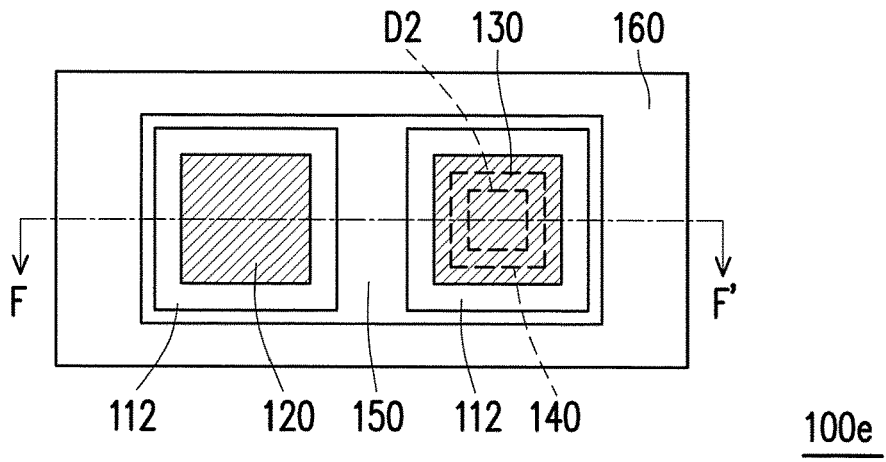
FIG. 7A is a top view of a μLED according to still another embodiment of the invention.
Figure 7B:
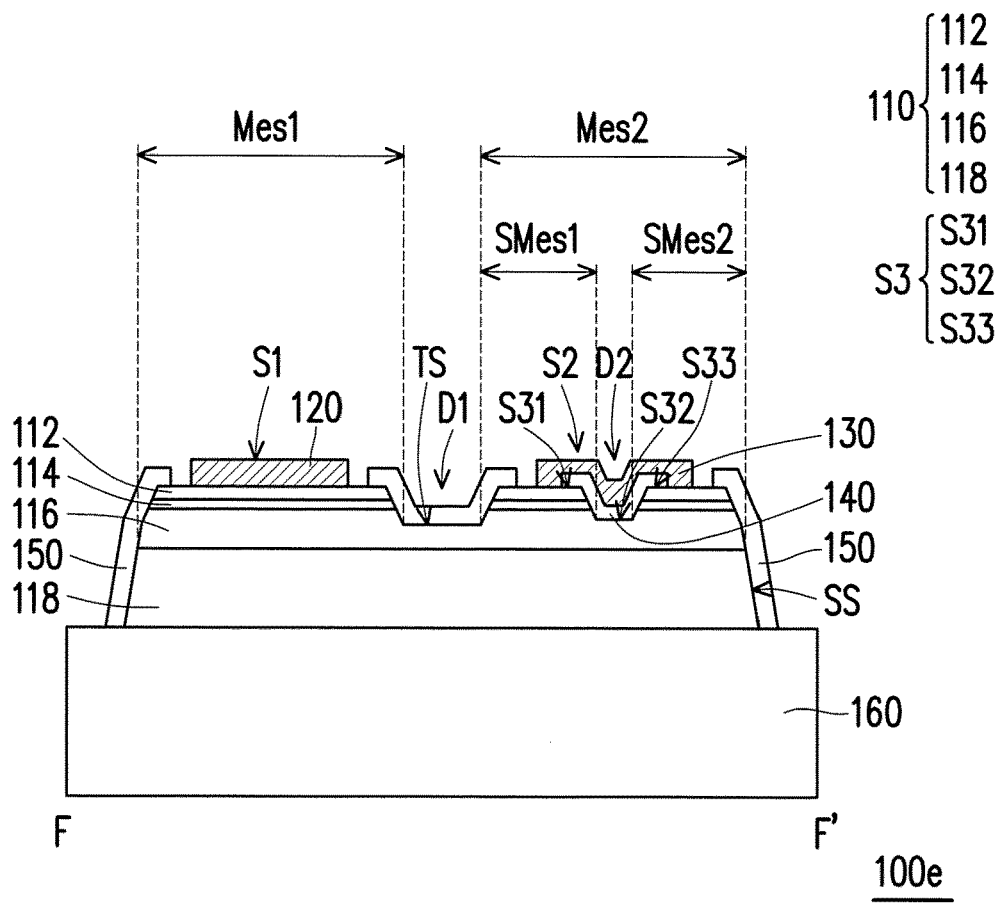
FIG. 7B is a cross-sectional view of FIG. 7A viewing along a section line F-F.

FIG. 7A is a top view of a μLED according to still another embodiment of the invention. FIG. 7B is a cross-sectional view of FIG. 7A viewing along a section line F-F.

Referring to FIG. 7A and FIG. 7B, the μLED 100e of the embodiment of FIG. 7A and FIG. 7B is substantially similar to the μLED 100 of the embodiment of FIG. 1A and FIG. 1B, and a main difference there between is that in the present embodiment, the current spreading layer 140 of the μLED 100e is disposed at the second mesa portion Mes2, a part of the first sub mesa portion SMes1 and a part of the second sub mesa portion SMes2, where the current spreading layer 140 electrically contacts the second type doped semiconductor layer 116 located at the second mesa portion Mes2.

Figure 8A:
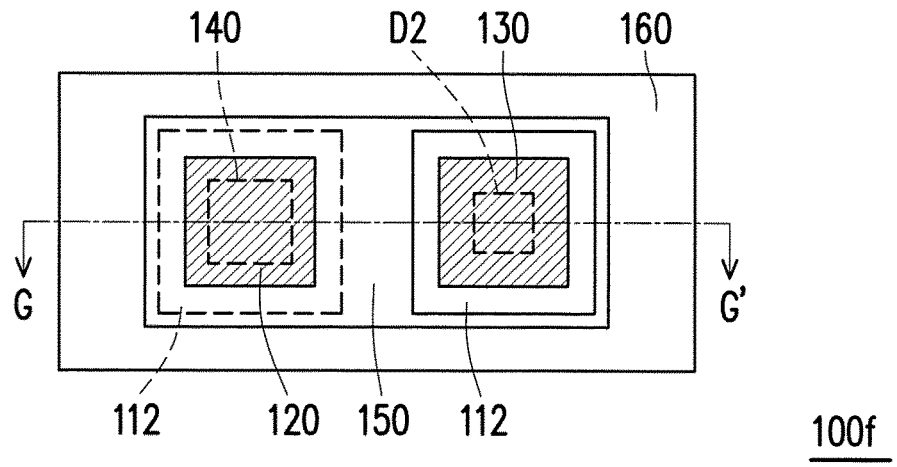
FIG. 8A is a top view of a μLED according to still another embodiment of the invention.
Figure 8B:
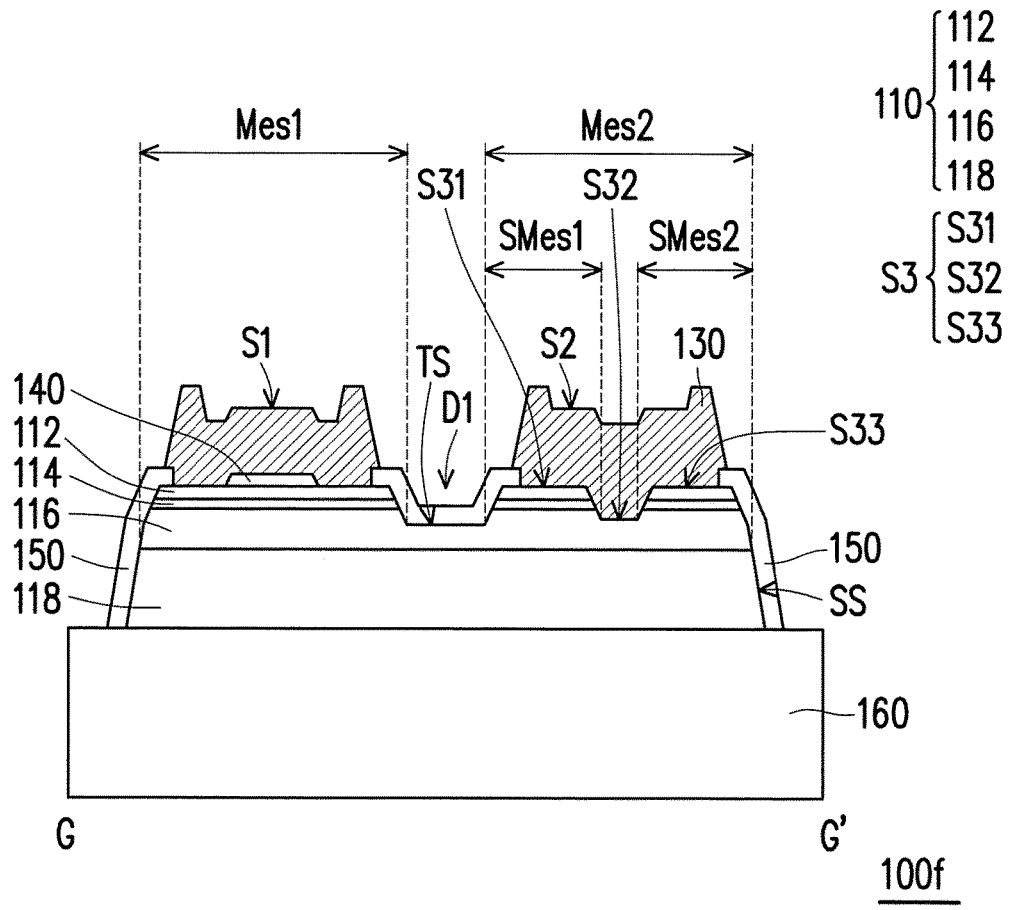
FIG. 8B is a cross-sectional view of FIG. 8A viewing along a section line G-G.
Figure 9A:
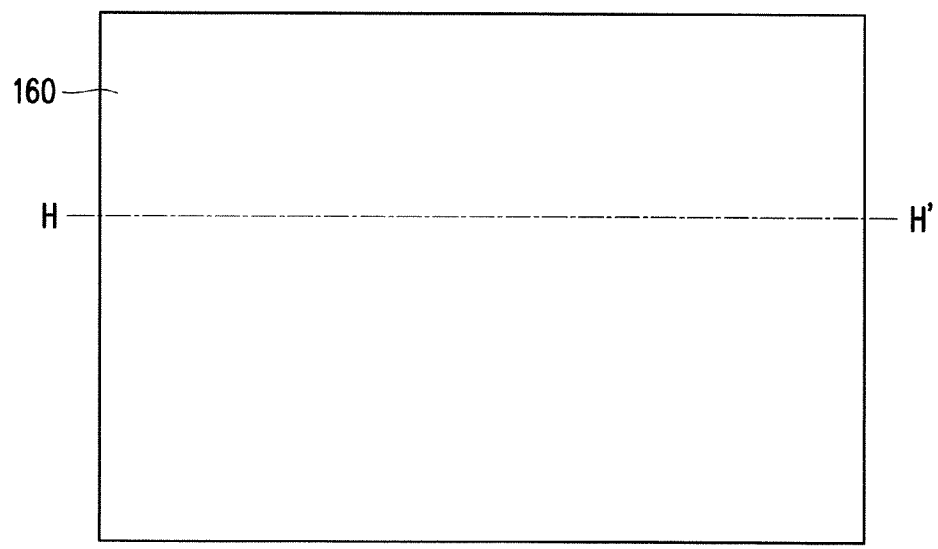
Figure 9B:
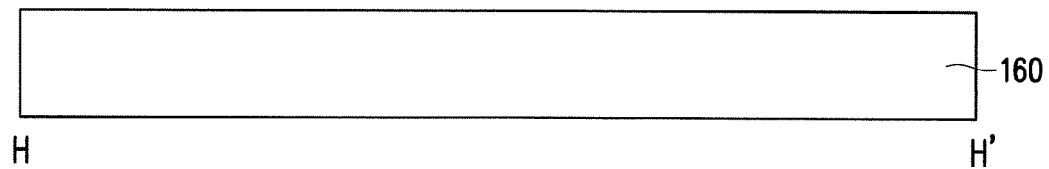
Figure 10A:
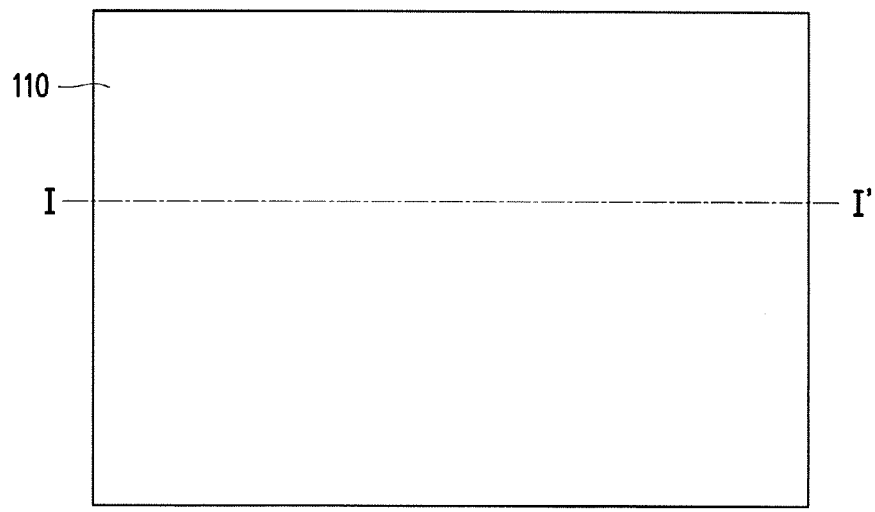
Figure 10B:
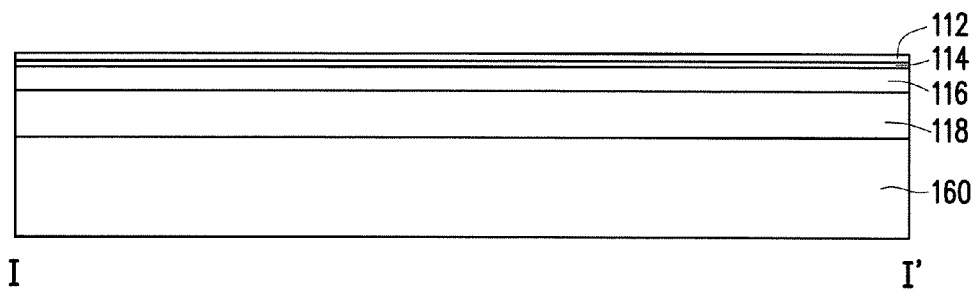

FIG. 8A is a top view of a μLED according to still another embodiment of the invention. FIG. 8B is a cross-sectional view of FIG. 8A viewing along a section line G-G.

Referring to FIG. 8A and FIG. 8B, the μLED 100g of the embodiment of FIG. 8A and FIG. 8B is substantially similar to the μLED 100 of the embodiment of FIG. 1A and FIG. 1B, and a main difference there between is that the first electrode 120 covers the current spreading layer 140. In other words, the current spreading layer 140 is located within a projection area of the first electrode 120 projected to the epitaxial stacked layer 110. The first surface S1 of the first electrode 120 exposed to external has different horizontal heights, and the second surface S2 of the second electrode 130 exposed to external has different horizontal heights. At least a part of the first surface S1 and at least a part of the second surface S2 are in a same horizontal plane.

FIG. 9A to FIG. 20A are top views of a manufacturing process of a μLED of according to another embodiment of the invention. FIG. 9B to FIG. 20B are cross-sectional views of the manufacturing process of FIG. 9A to FIG. 20A. FIG. 21 is a schematic diagram of a μLED in a heating state according to an embodiment of the invention. FIG. 22A to FIG. 26A are top views of a manufacturing process of a μLED of according to still another embodiment of the invention. FIG. 22B to FIG. 26B are cross-sectional views of the manufacturing process of FIG. 22A to FIG. 26A.

The manufacturing process of FIG. 9A, FIG. 9B, FIG. 10A and FIG. 10B is similar to that of FIG. 2A and FIG. 2B, and detail thereof is not repeated.

Figure 11A:
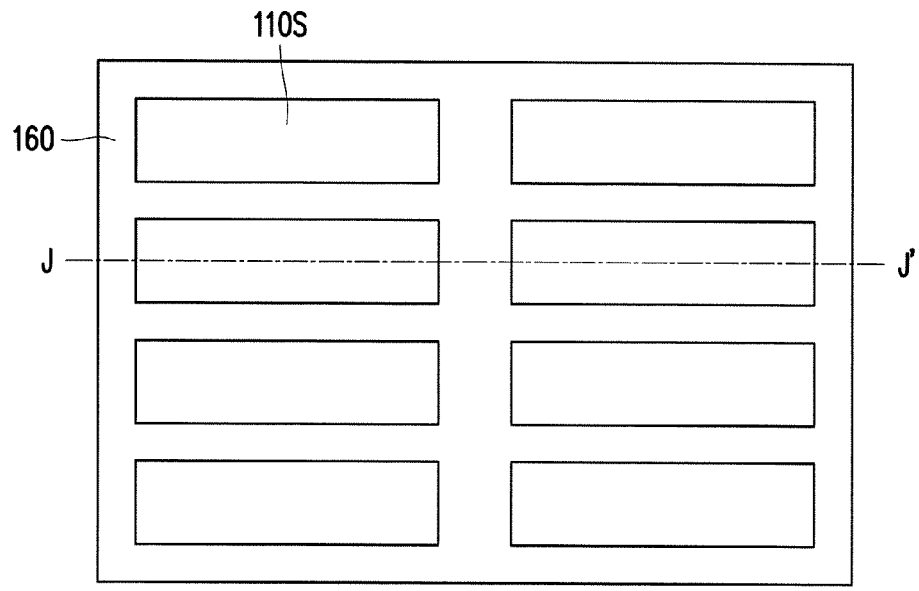
Figure 11B:
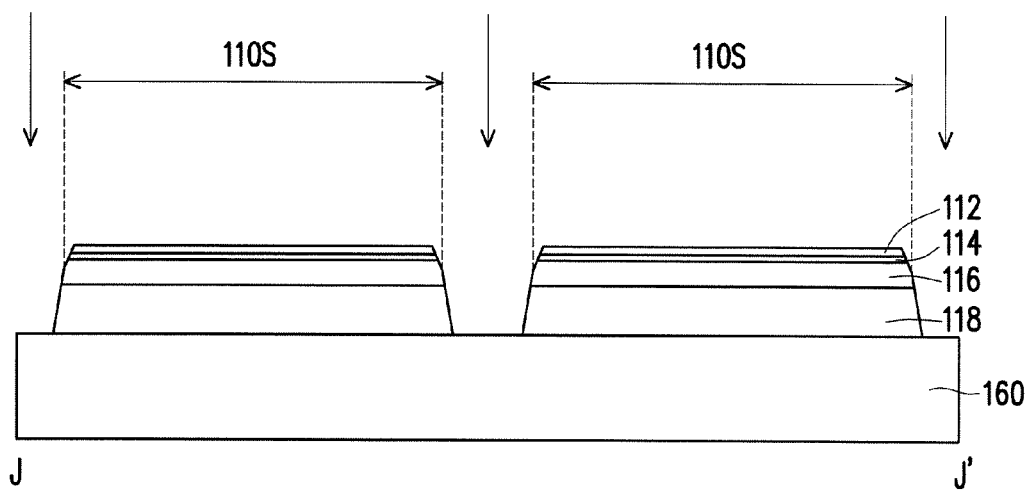

Referring to FIG. 11A and FIG. 11B, the epitaxial stacked layer 110 is etched to expose a part of the surface of the substrate 160, such that the epitaxial stacked layer 110 forms a plurality of sub epitaxial stacked layers 110S separated from each other. Each of the sub epitaxial stacked layers 110S includes a part of the first type doped semiconductor layer 112, a part of the light emitting layer 114, a part of the second type doped semiconductor layer 116 and a part of the unintentionally doped semiconductor layer 118.

Figure 12A:
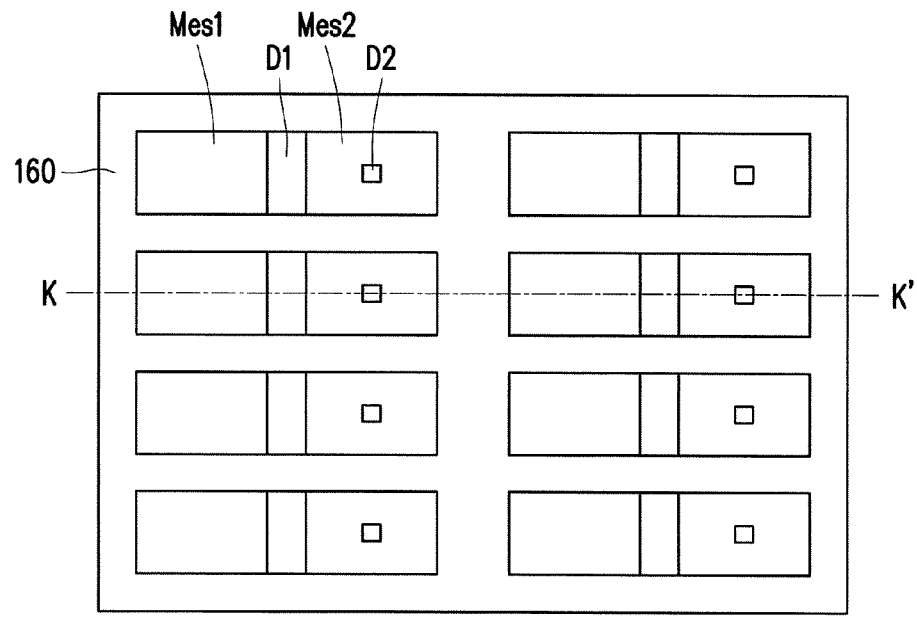
Figure 12B:
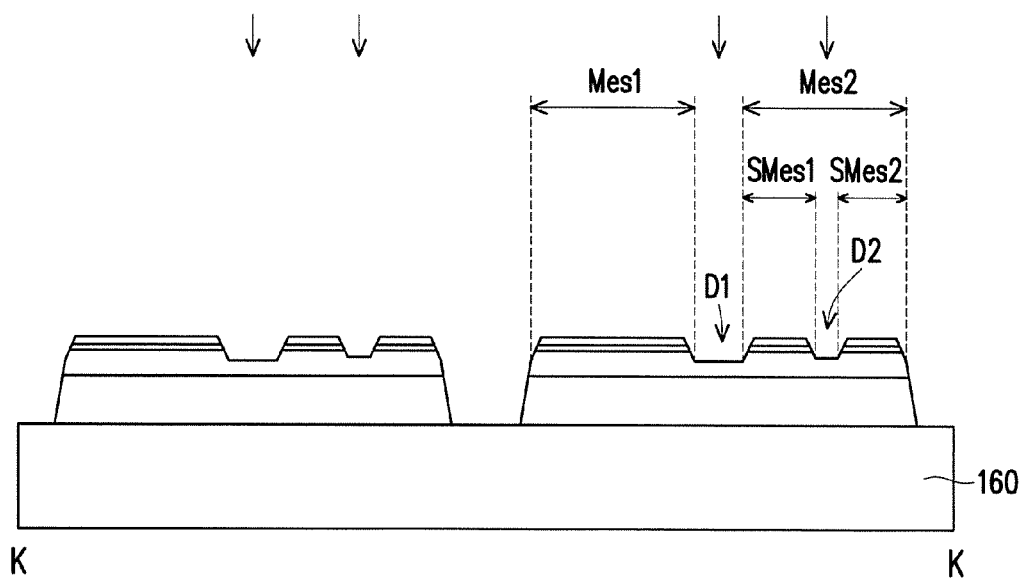

Referring to FIG. 12A and FIG. 12B, a part of the first type doped semiconductor layer 112, a part of the light emitting layer 114 and a part of the second type doped semiconductor layer 116 in each of the sub epitaxial stacked layers 110S are etched to make each of the sub epitaxial stacked layers 110S have the first recess portion D1 and the second recess portion D2. The first recess portion D1 defines the first mesa portion Mes1 and the second mesa portion Mes2 and exposes the second type doped semiconductor layer 1160 to form the first type conductive region and the second type conductive region respectively. The second mesa portion Mes2 has the second recess portion D2. The second recess portion D2 defines the first sub mesa portion SMes1 and the second sub mesa portion SMes2 in the second mesa portion Mes2. The second recess portion D2 exposes the second type doped semiconductor layer 116, a part of the first type doped semiconductor layer 112 and a part of the light emitting layer 114 in the second mesa portion Mes2. In the present embodiment, an area and a shape of an orthogonal projection of the first mesa portion Mes1 are substantially the same to an area and a shape of an orthogonal projection of the second mesa portion Mes2. The first recess portion D1 is located between the first type conductive region and the second type conductive region.

Figure 13A:
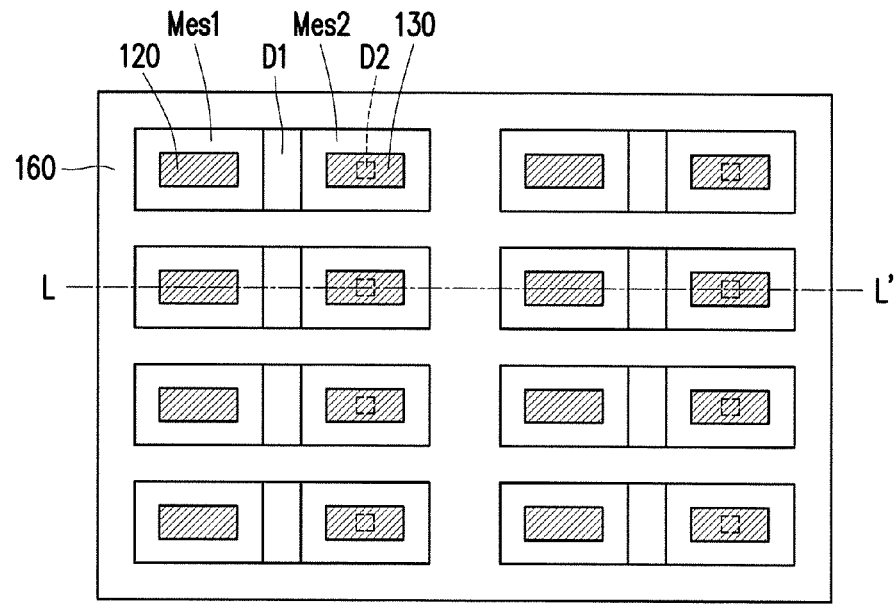
Figure 13B:
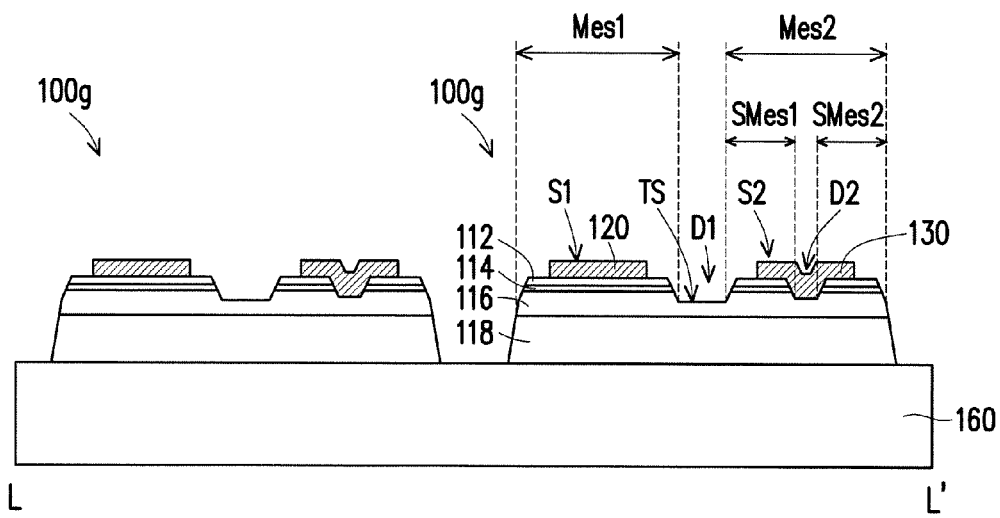

Referring to FIG. 13A and FIG. 13B, a plurality of the first electrodes 120 are formed on the first mesa portions Mes1 in the first type conductive regions respectively. A plurality of the second electrodes 130 are formed on the second mesa portions Mes2 in the second type conductive regions respectively. Each of the first electrodes 120 is electrically connected to the corresponding sub epitaxial stacked layer 110S, and each of the second electrodes 130 is electrically connected to the corresponding sub epitaxial stacked layer 110S, so as to form a plurality of the μLEDs 100g on the substrate 160. In each of the μLEDs 100g, the second electrode 130 contacts the first type doped semiconductor layer 112, the light emitting layer 114 and the second type doped semiconductor layer 116 located on the second mesa portion Mes2, and each of the second electrodes 130 wraps each of the second recess portions D2. Certainly, in other embodiments, the μLEDs 100g may also be added with the aforementioned current spreading layer or insulation layer, etc., which is not limited by the invention.

Figure 14A:
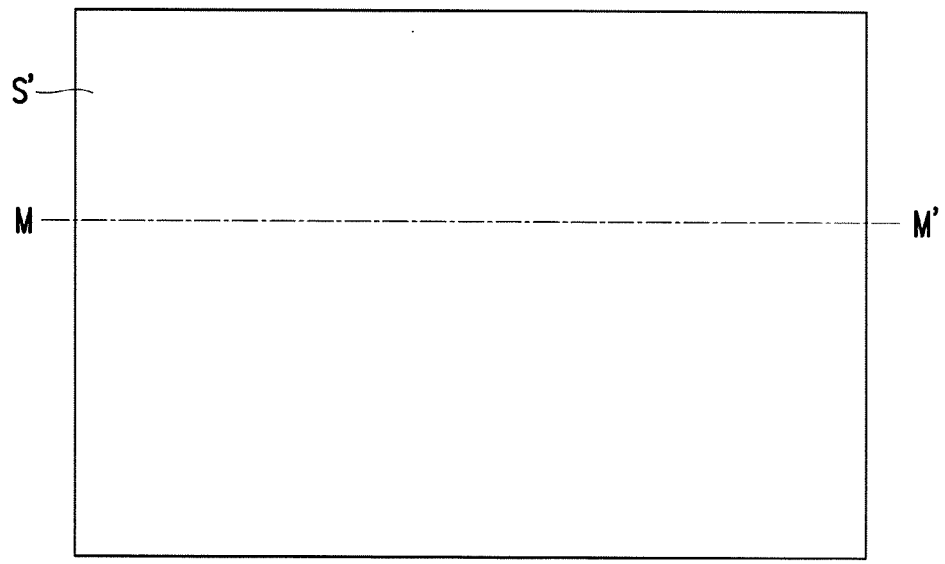
Figure 14B:
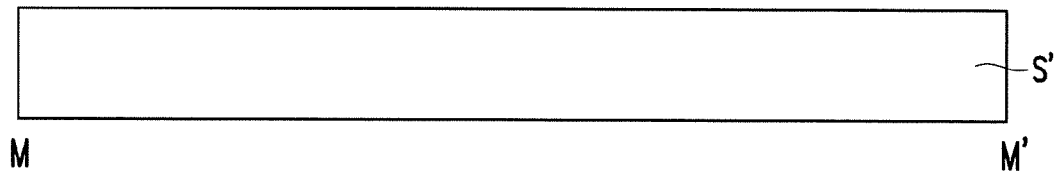

Referring to FIG. 14A and FIG. 14B, a temporary substrate S' is provided. An adhesive layer is, for example, configured on the temporary substrate S'.

Figure 15A:
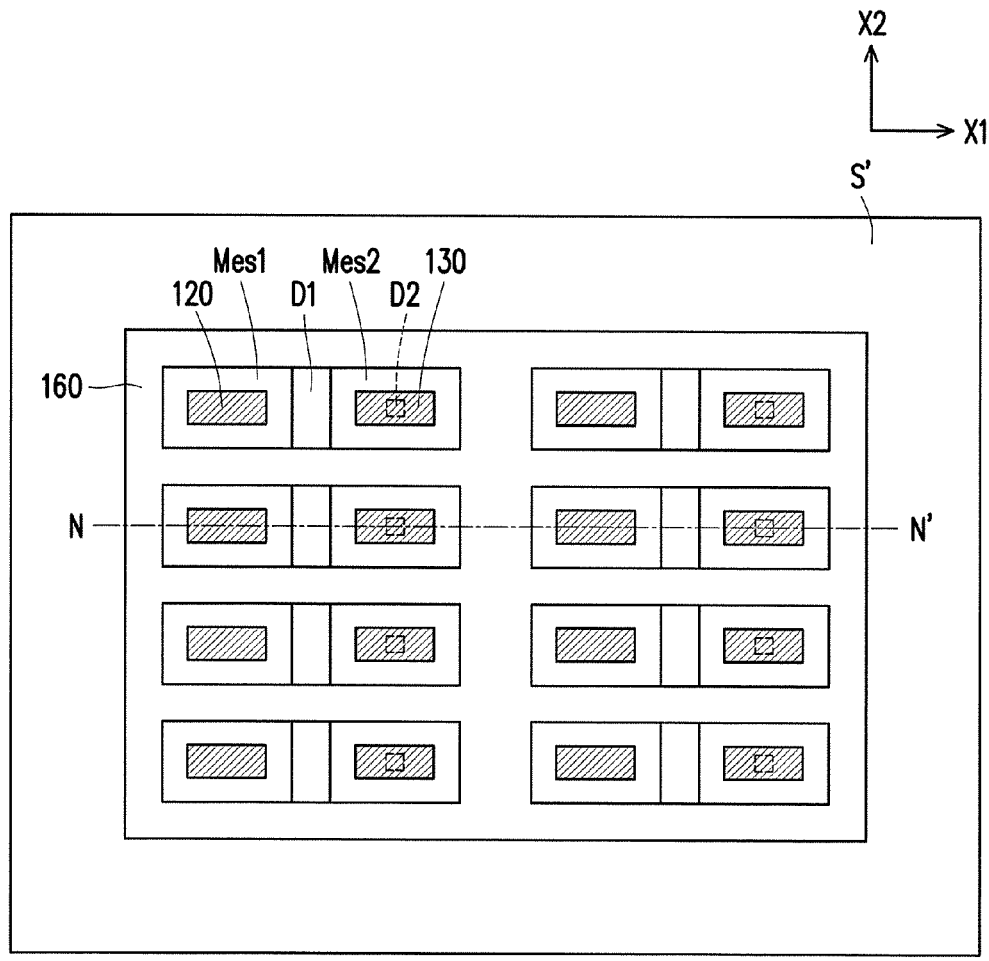
Figure 15B:
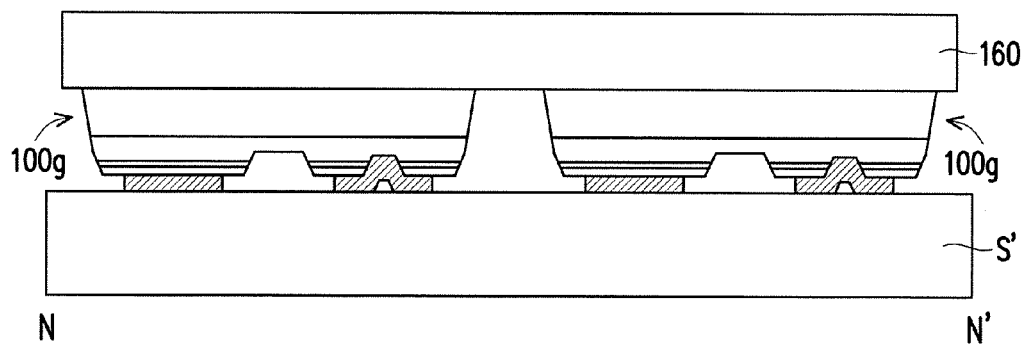

Referring to FIG. 15A and FIG. 15B, the μLEDs 100g on the substrate 160 are inversely disposed on the temporary substrate S'.

Figure 16A:
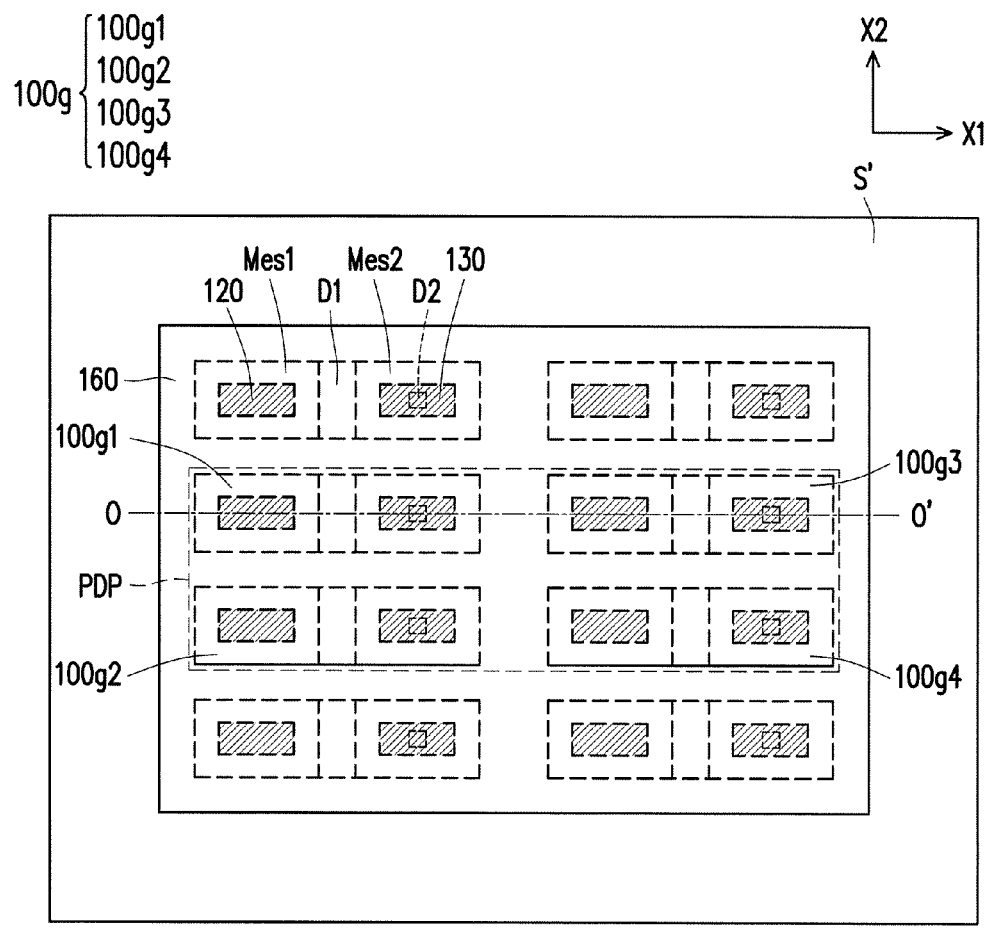
Figure 16B:
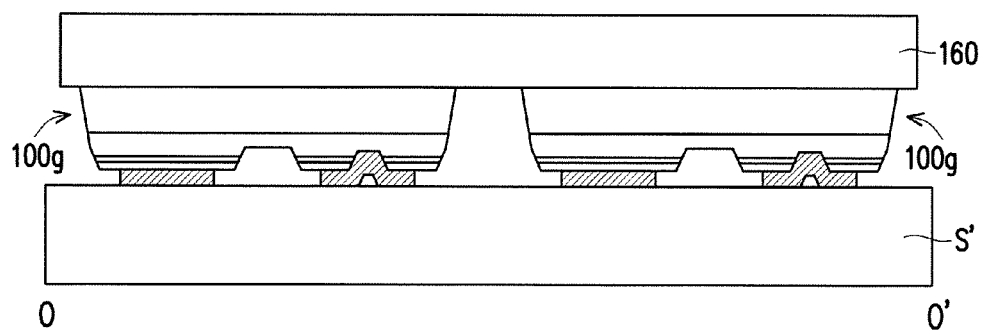

Referring to FIG. 16A and FIG. 16B, at least a part of the μLEDs 100g on the substrate 160 disposed on the temporary substrate S' is selected as a predetermined detaching portion PDP. An amount of the μLEDs 100g in the predetermined detaching portion PDP is, for example, four, which are, for example, a first μLED 100g1, a second μLED 100g2, a third μLED 100g3 and a fourth μLED 100g4. In other embodiments, the amount of the μLEDs 100g in the predetermined detaching portion PDP may also be greater than four or less than four, which is not limited by the invention.

Figure 17A:
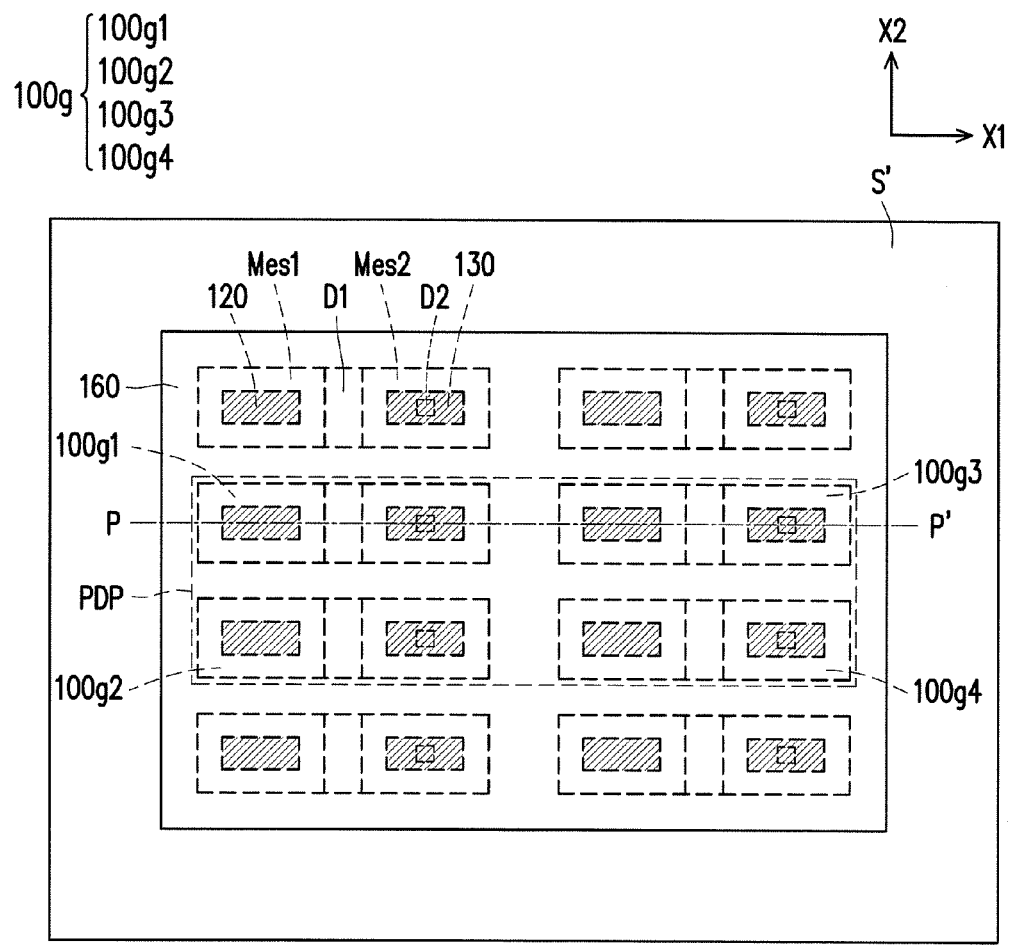
Figure 17B:
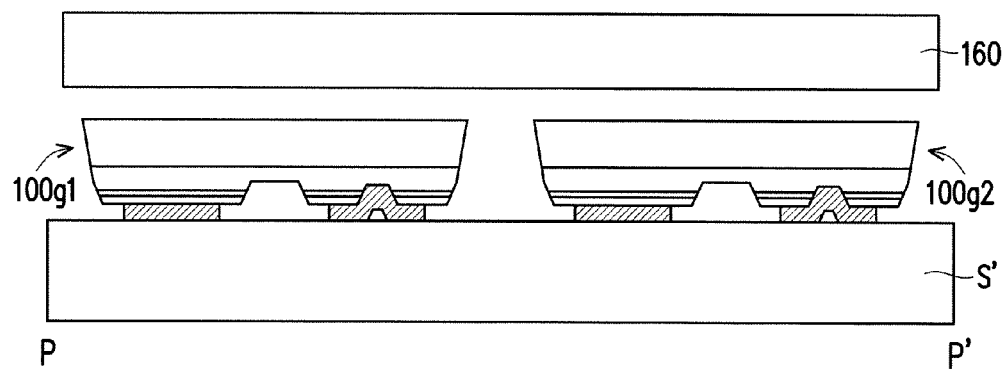

Referring to FIG. 17A and FIG. 17B, the predetermined detaching portion PDP is detached from the other portion of the substrate 160, and a detaching method is, for example, a laser lift-off method, a photochemical reaction method or a photophysical reaction method.

Figure 18A:
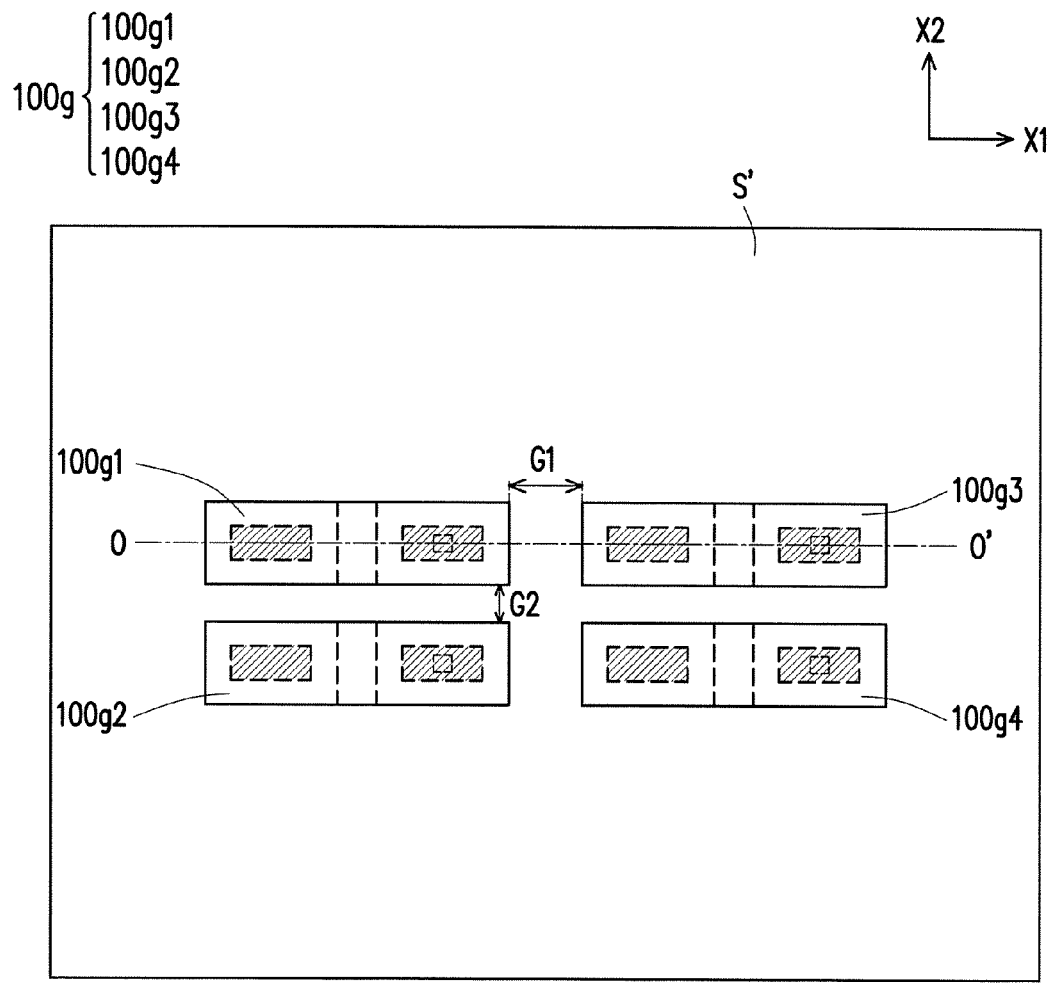
Figure 18B:
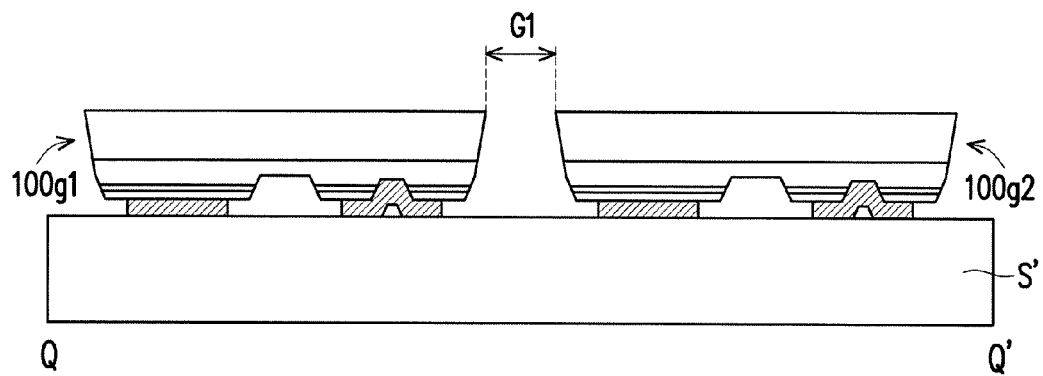

Referring to FIG. 18A and FIG. 18B, the substrate 160 is removed to complete transferring the μLEDs 100g in the predetermined detaching portion PDP to the temporary substrate S'. Any of the μLEDs 100g in the predetermined detaching portion PDP on the temporary substrate S' is the first μLED 100g1. The first μLED 100g1 is located adjacent to the second μLED 100g2 of the μLEDs 100g in a first direction X1, and the first μLED 100g1 and the second μLED 100g2 have a first gap G1 there between. The first μLED 100g1 is located adjacent to the third μLED 100g3 of the μLEDs 100g in a second direction X2 different to the first direction X1, and the first μLED 100g1 and the third μLED 100g3 have a second gap G2 there between. In detail, the first μLED 100g1 is located adjacent to the third μLED 100g3 in the first direction X1, and located adjacent to the second μLED 100g2 in the second direction X2. The fourth μLED 100g4 is located adjacent to the third μLED 100g3 in the second direction X2, and located adjacent to the second μLED 100g2 in the first direction X1. The first direction X1 is, for example, perpendicular to the second direction X2, and in other embodiments, the first direction X1 and the second direction X2 may also include a non-90 degree angle, which is not limited by the invention. In the present embodiment, the first gap G1 is greater than the second gap G2, and in other embodiments, the first gap G1 may be equal to the second gap G2, which is not limited by the invention. The first gap G1 and the second gap G2 may be designed to correspond to each other according to a corresponding package or module design match of the µLED. Moreover, a length of an orthogonal projection of any µLED on the temporary substrate S' in the first direction X1 is greater than or equal to a length of the orthogonal projection of the µLED on the temporary substrate S' in the second direction X2. In other embodiments, the first gap G1 between the first µLED 100g1 and the second µLED 100g2 is greater than or equal to the second gap G2 between the first µLED 100g1 and the third µLED 100g3. A shape of any µLED 100g on the temporary substrate S' may be a rectangle or a square, which is not limited by the invention.

Figure 19A:
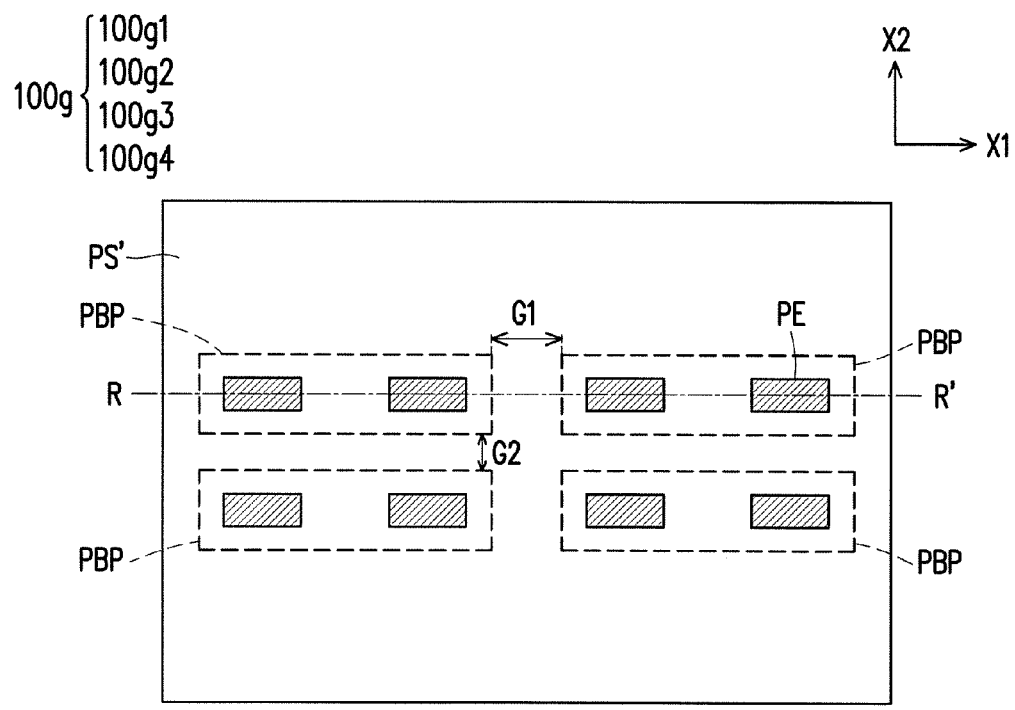
Figure 19B:
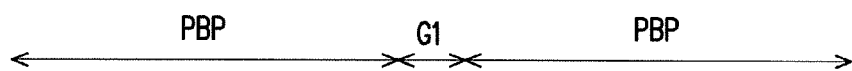
Figure 19B:
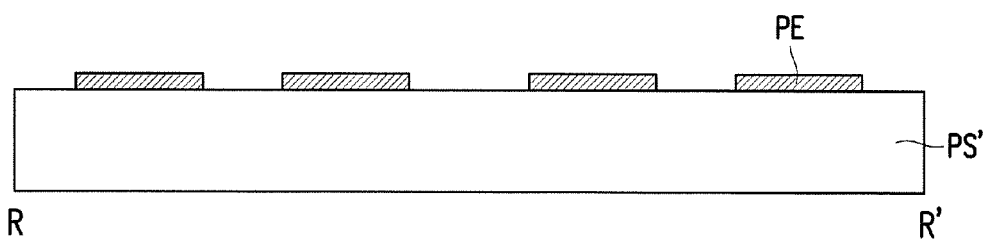

Referring to FIG. 19A and FIG. 19B, a permanent substrate PS' is provided, and the permanent substrate PS' has a plurality of predetermined bonding positions PBP thereon, and the predetermined bonding positions PBP have gaps corresponding to the first gap G1 and the second gap G2 of the µLEDs 100g there between. The predetermined bonding positions PBP have a plurality of predetermined bonding electrodes PE disposed corresponding to the first electrodes 120 and the second electrodes 130 of the µLEDs 100g.

Figure 20A:
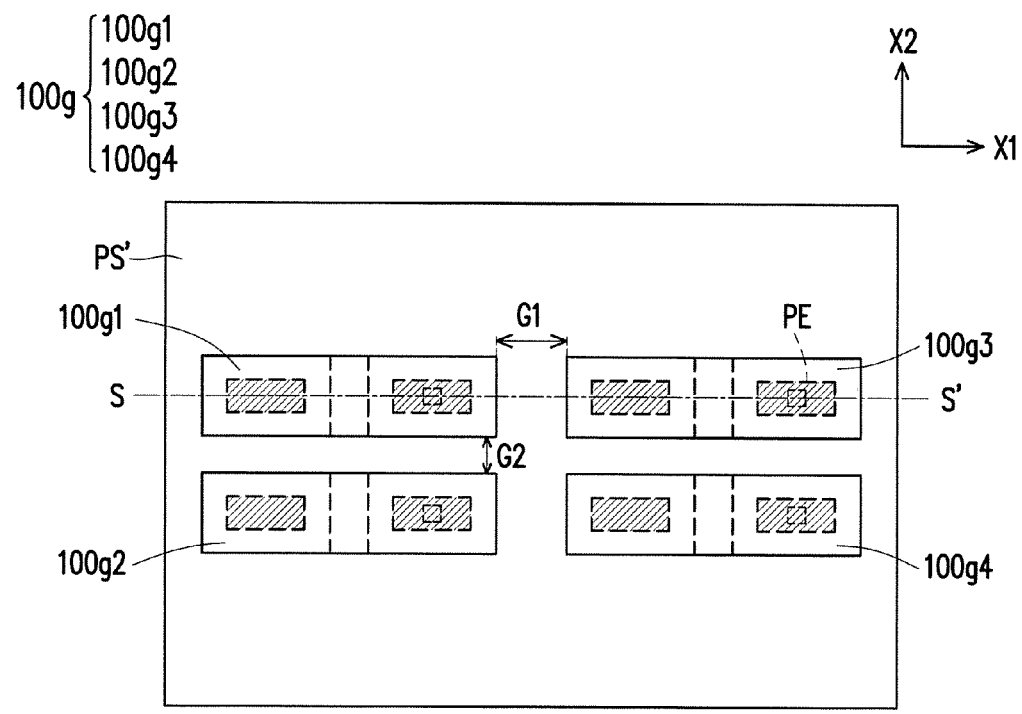
Figure 20B:
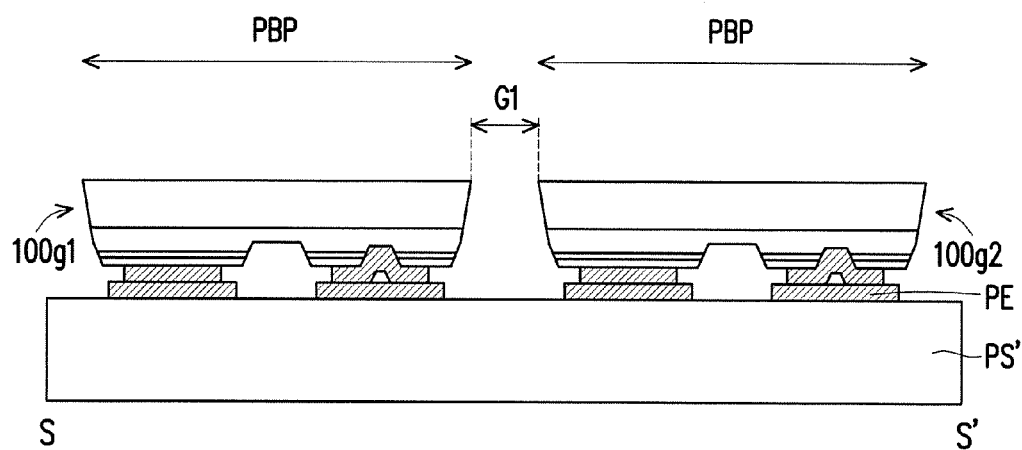
Figure 21:
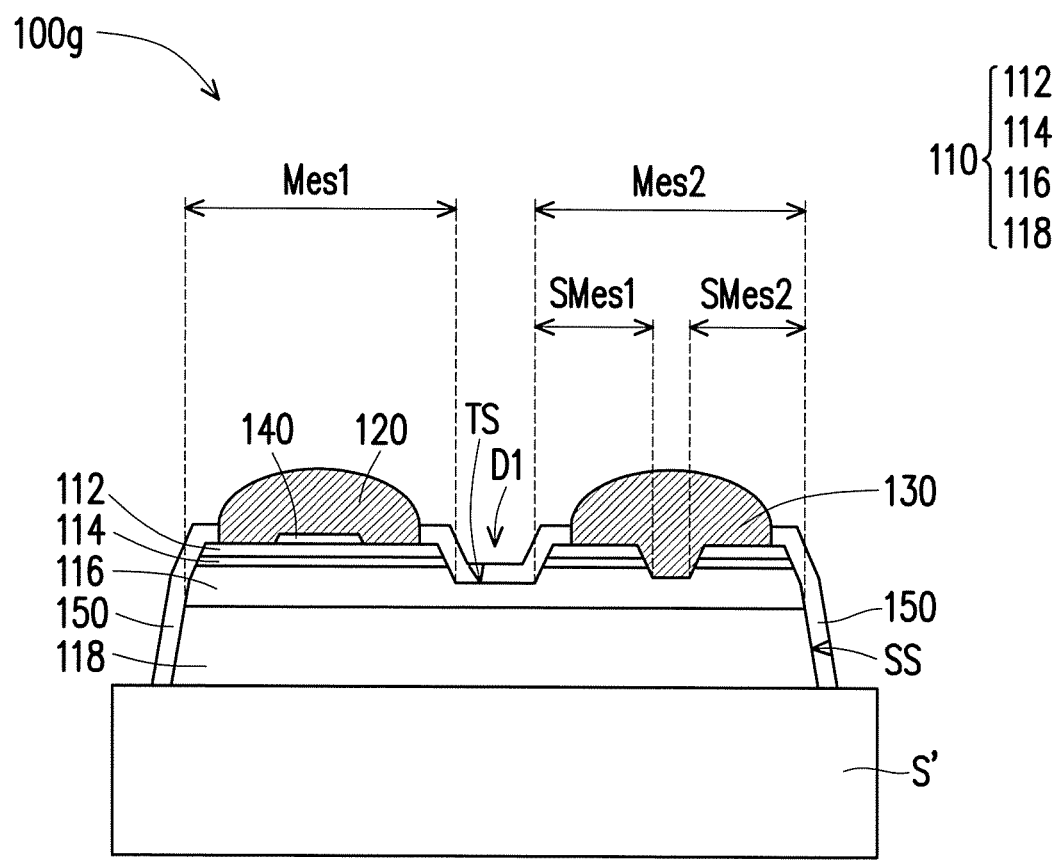
FIG. 21 is a schematic diagram of a μLED in a heating state according to an embodiment of the invention.

Referring to FIG. 20A and FIG. 20B, the µLEDs 100g in the predetermined detaching portion PDP on the temporary substrate S' shown in FIG. 18A and FIG. 18B are transferred to the permanent substrate PS', and a plurality of the first electrodes 120 and a plurality of the second electrodes 130 of the µLEDs 100g are electrically connected to the predetermined bonding electrodes PE on the permanent substrate PS'. During the aforementioned process of transferring the µLEDs to the permanent substrate, a heating process, a pressurization process or a combination thereof may be added. Referring to FIG. 21, after the µLEDs 100g are heated by the heating process, the first electrodes 120 and the second electrodes 130 thereof form semi-arc shapes. The first electrodes 120 and the second electrodes 130 with a plurality of semi-arc shapes in the µLEDs 100g are bonded to the predetermined bonding electrodes PE on the permanent substrate PS' through eutectic or welded bonding. The semi-arc shaped first electrodes 120 and second electrodes 130 may be directly bonded and electrically connected to the predetermined bonding electrodes PE on the permanent substrate PS'.

Figure 22A:
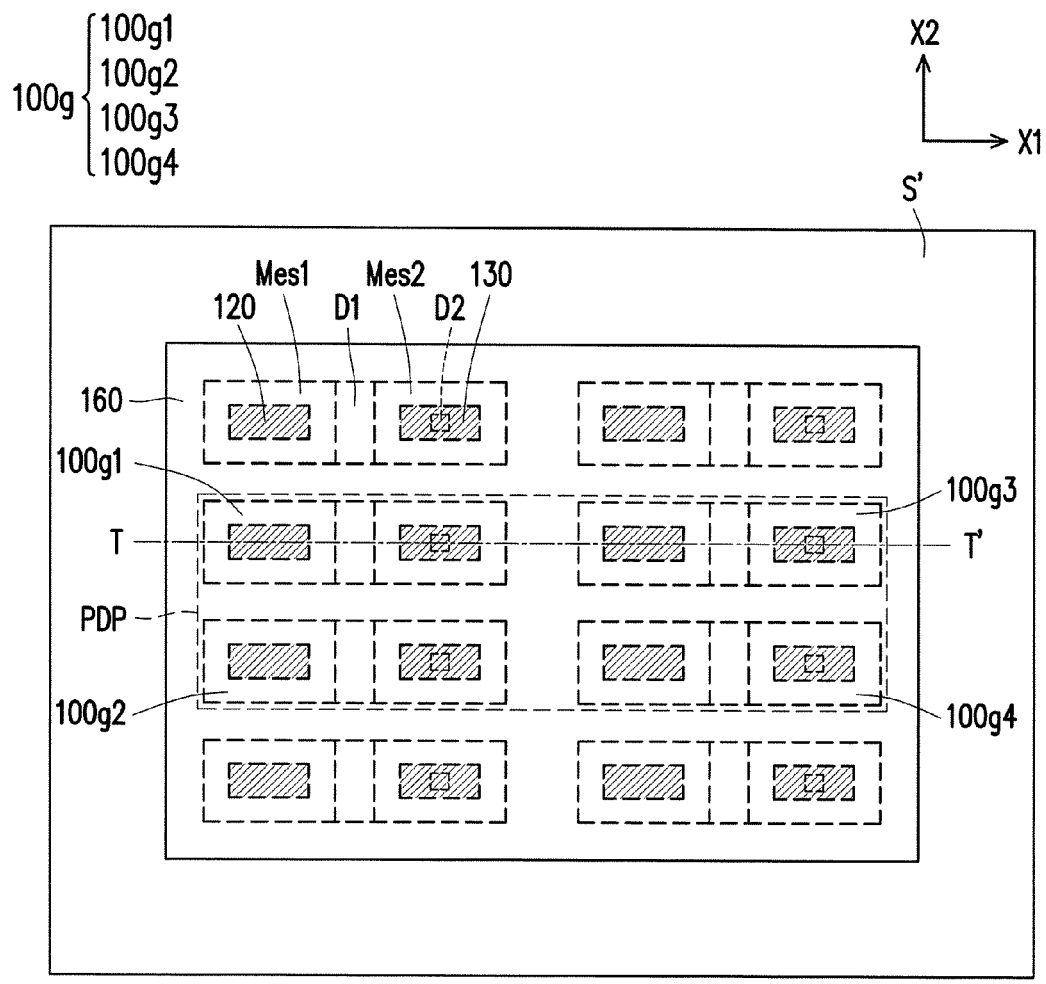
Figure 22B:
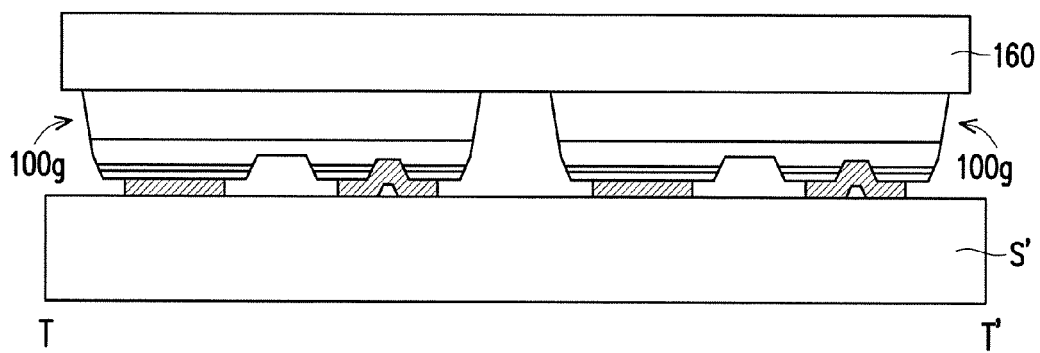

Referring to FIG. 16A and FIG. 16B and referring to FIG. 22A and FIG. 22B, at least a part of the µLEDs 100g on the substrate 160 is selected as the predetermined detaching portion PDP, and the part of substrate 160 carrying the predetermined detaching portion PDP is sliced from the other part of the substrate 160, and a slicing method thereof is, for example, a laser slicing method, a photochemical reaction method or a photophysical reaction method, so as to form a plurality of traces on the substrate 160. A splitting device is adopted to separate the predetermined detaching portion PDP from the other part of the substrate 160 along the traces.

Figure 23A:
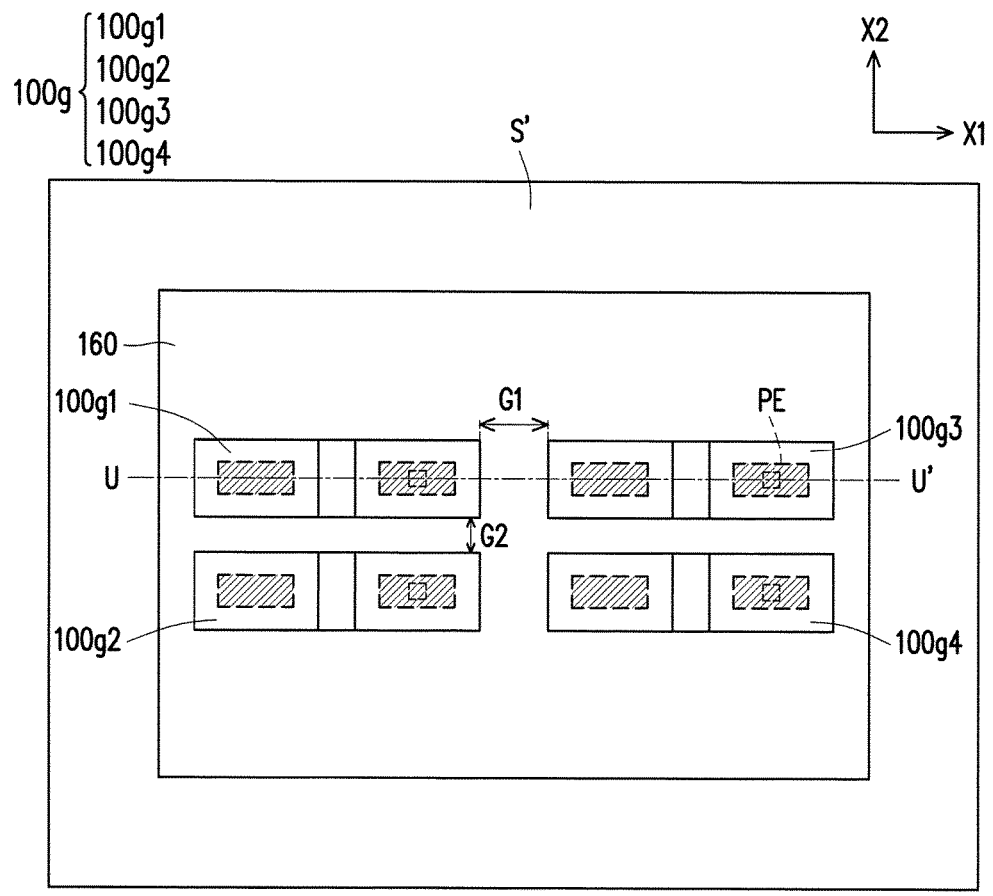
Figure 23B:
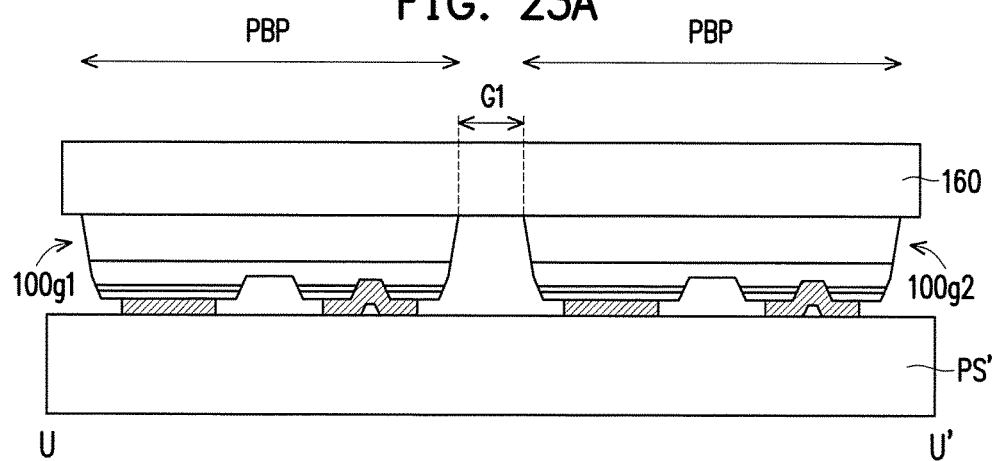

Referring to FIG. 23A and FIG. 23B, the µLEDs 100g on the sliced predetermined detaching portion PDP are transferred to the temporary substrate S'.

Figure 24A:
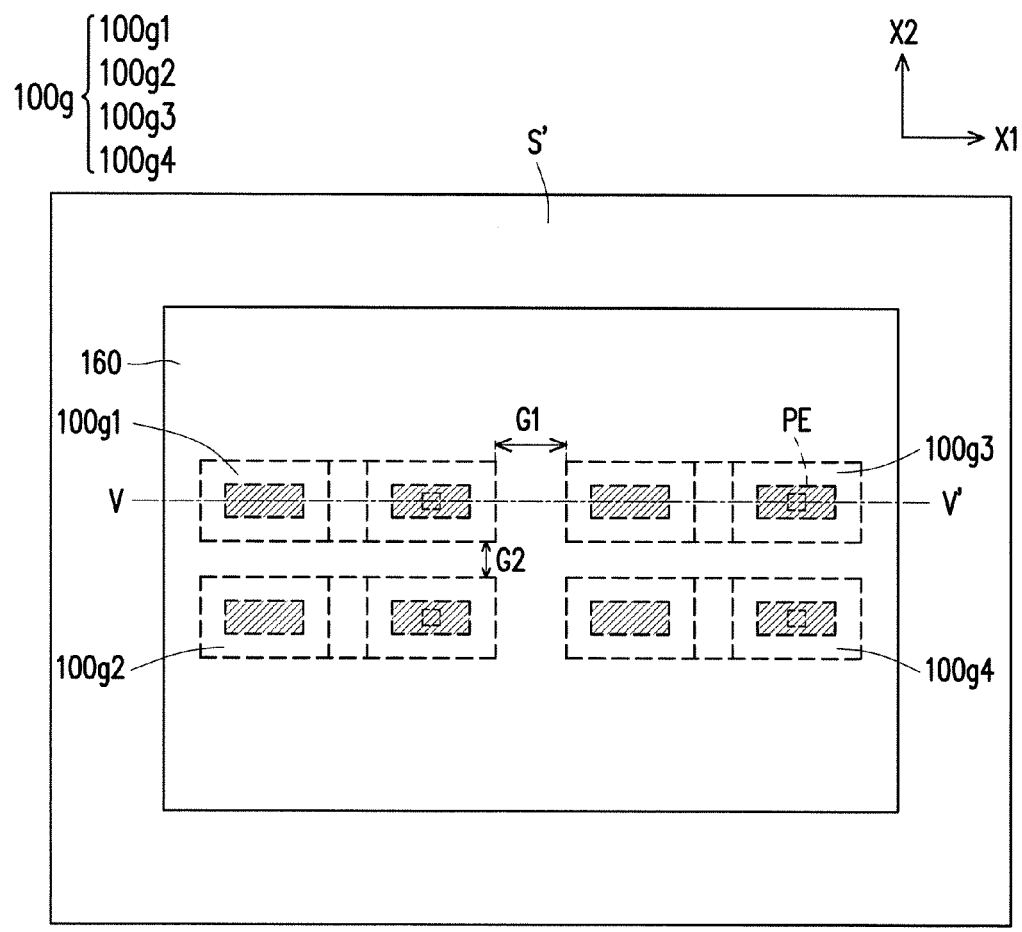
Figure 24B:
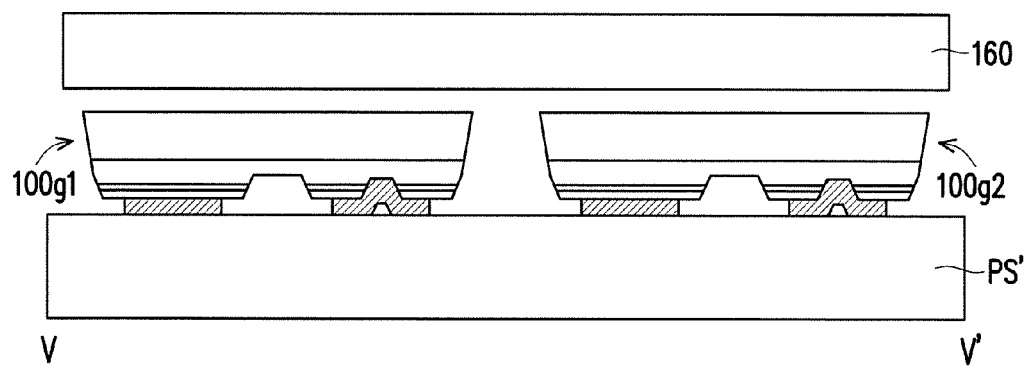

Referring to FIG. 24A and FIG. 24B, the substrate 160 carrying the sliced predetermined detaching portion PDP is detached, and a detaching method is, for example, a laser lift-off method, a photochemical reaction method or a photophysical reaction method, so as to detach the substrate 160 carrying the predetermined detaching portion PDP from the µLEDs 100g in batches or in one time.

Figure 25A:
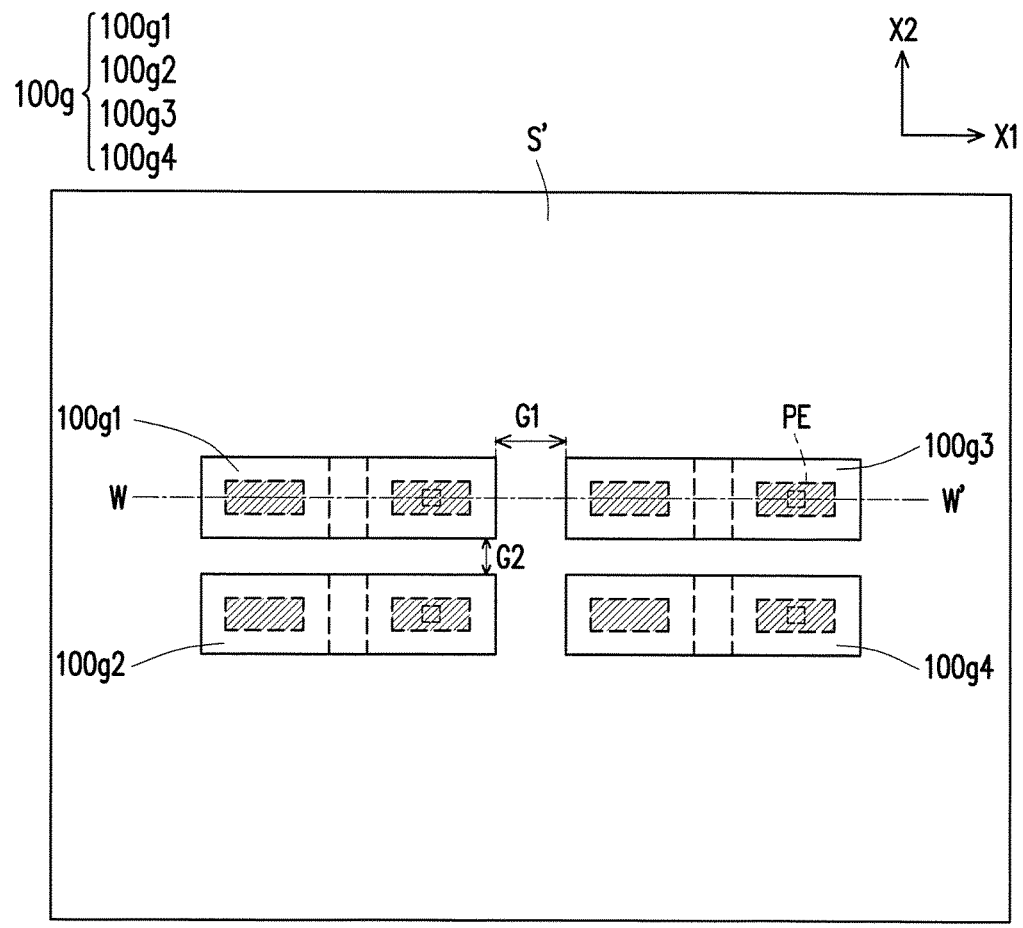
Figure 25B:
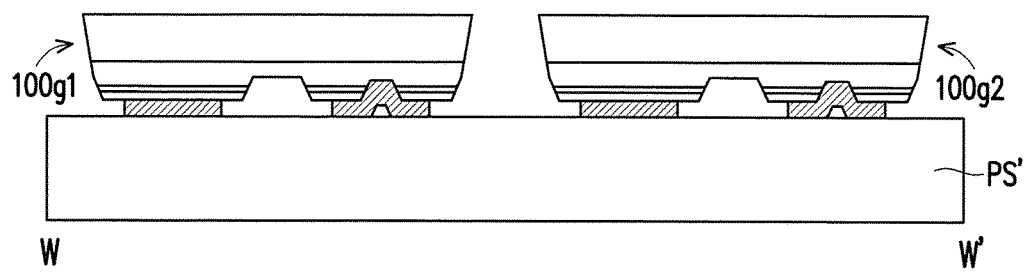

Referring to FIG. 25A and FIG. 25B, the substrate 160 is removed to complete transferring the µLEDs 100g in the predetermined detaching portion PDP to the temporary substrate S'. Any of the µLEDs 100g in the predetermined detaching portion PDP on the temporary substrate S' is the first µLED 100g1. The first µLED 100g1 is located adjacent to the second µLED 100g2 of the µLEDs 100g in the first direction X1, and the first µLED 100g1 and the second µLED 100g2 have the first gap G1 there between. The first µLED 100g1 is located adjacent to the third µLED 100g3 of the µLEDs 100g in the second direction X2 different to the first direction X1, and the first µLED 100g1 and the third µLED 100g3 have the second gap G2 there between.

Figure 26A:
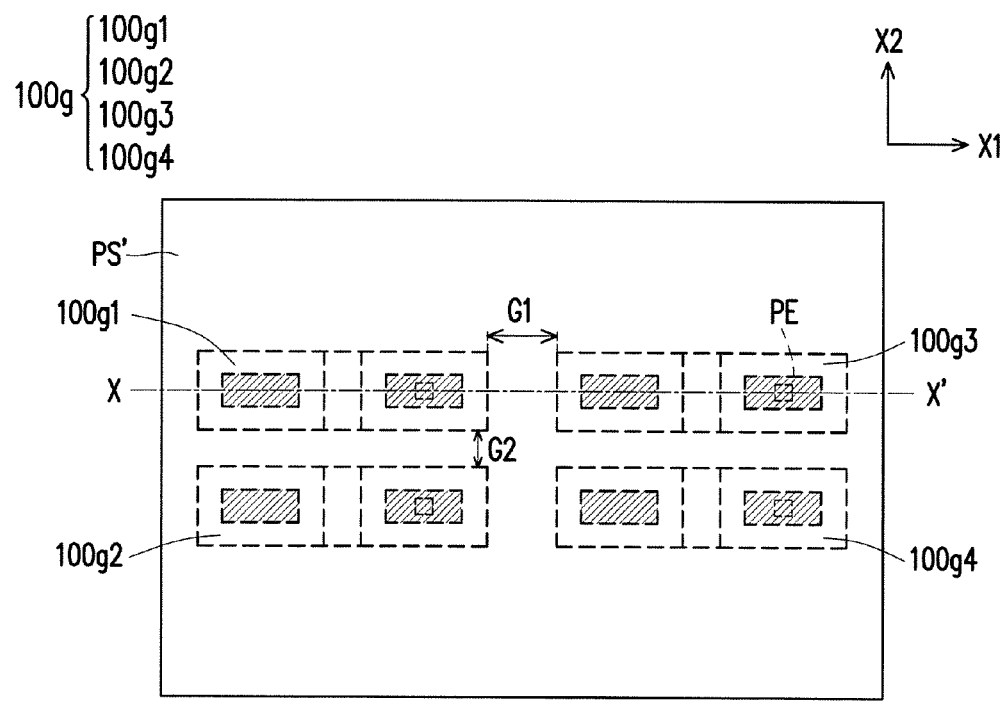
Figure 26B:
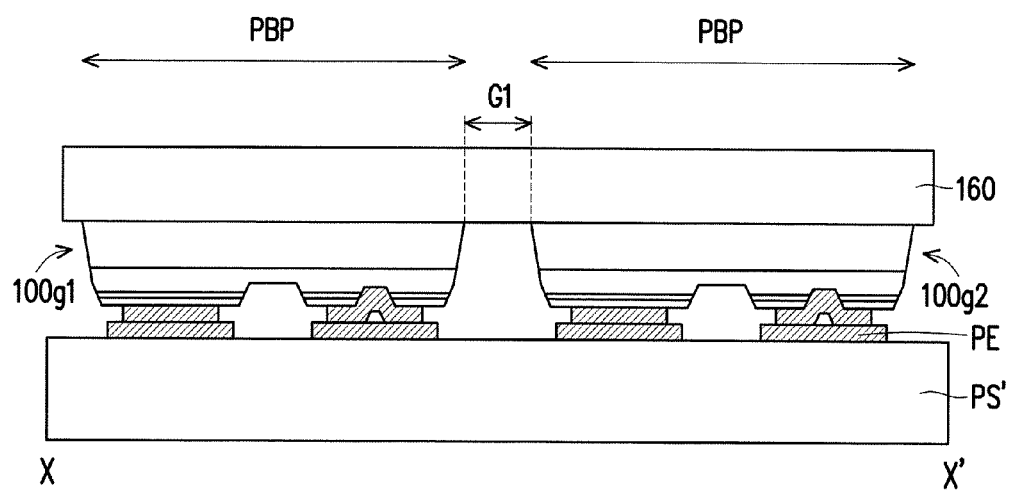

Referring to FIG. 26A and FIG. 26B, the permanent substrate PS' of FIG. 19A and FIG. 19B is provided, and the µLEDs 100g in the predetermined detaching portion PDP on the temporary substrate S' are transferred to the permanent substrate Ps' and are electrically connected to the predetermined bonding electrodes PE on the permanent substrate PS', and the process thereof is similar to the process mentioned in the embodiments of FIG. 19A, FIG. 19B, FIG. 20A, FIG. 20B and FIG. 21, and detail thereof is not repeated.

In summary, in the µLED of the invention, through the design of contacting the second electrode with the first type doped semiconductor layer, the light emitting layer and the second type doped semiconductor layer located on the second mesa portion, compared to the structure of the prior art where the protective layer is evaporated and etched in the hole, the µLED of the invention has a simple structure and a higher manufacturing yield, and the area of the second electrode is not limited. Moreover, the aforementioned µLED may be manufactured according to the manufacturing method of the µLED of the invention, so that the manufacturing method of the µLED of the invention has a simple manufacturing flow and higher manufacturing yield.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A micro light emitting diode, comprising:
   an epitaxial stacked layer, comprising a first type doped semiconductor layer, a light emitting layer and a second type doped semiconductor layer, the light emitting layer being located between the first type doped semiconductor layer and the second type doped semiconductor layer, and the first type doped semiconductor layer and the second type doped semiconductor layer being opposite in electrical property, wherein the epitaxial stacked layer has a first mesa portion and a second mesa portion to form a first type conductive region and a second type conductive region respectively, and the first mesa portion and the second mesa portion are connected through the second type doped semiconductor layer;
   a first electrode, electrically connected to the epitaxial stacked layer, and disposed on the first mesa portion; and a second electrode, electrically connected to the epitaxial stacked layer, and disposed on the second mesa portion, wherein the second electrode contacts the first type doped semiconductor layer, the light emitting layer and the second type doped semiconductor layer located at the second mesa portion.

2. The micro light emitting diode as claimed in claim 1, wherein the epitaxial stacked layer has a first recess portion and a second recess portion, the first recess portion defines the first mesa portion and the second mesa portion and exposes a part of the second type doped semiconductor layer, and the second mesa portion has the second recess portion, the second recess portion defines a first sub mesa portion and a second sub mesa portion in the second mesa portion, and the second recess portion exposes the second type doped semiconductor layer, a part of the first type doped semiconductor layer and a part of the light emitting layer in the second mesa portion.

3. The micro light emitting diode as claimed in claim 1, wherein the first electrode has a first surface exposed to external, the second electrode has a second surface exposed to external, and at least a part of the first surface and at least a part of the second surface are in a same horizontal plane.

4. The micro light emitting diode as claimed in claim 1, wherein
  a part of the first type doped semiconductor layer, a part of the light emitting layer and a part of the second type doped semiconductor layer in the first mesa portion constitute a first diode,
  a part of the first type doped semiconductor layer, a part of the light emitting layer and a part of the second type doped semiconductor layer in the first sub mesa portion constitute a second diode,
  a part of the first type doped semiconductor layer, a part of the light emitting layer and a part of the second type doped semiconductor layer in the second sub mesa portion constitute a third diode,
  wherein a positive terminal of the first diode is coupled to the first electrode, and a negative terminal of the first diode is coupled to a negative terminal of the second diode and a negative terminal of the second diode.

5. The micro light emitting diode as claimed in claim 1, further comprising a current spreading layer, wherein the first electrode or the second electrode is electrically connected to the epitaxial stacked layer through the current spreading layer.

6. The micro light emitting diode as claimed in claim 1, wherein the first type doped semiconductor layer is one of a P-type doped semiconductor layer and an N-type doped semiconductor layer, and the second type doped semiconductor layer is the other one of the P-type doped semiconductor layer and the N-type doped semiconductor layer.

7. The micro light emitting diode as claimed in claim 1, further comprising a substrate, wherein the epitaxial stacked layer, the first electrode and the second electrode are disposed at a same side of the substrate.

8. The micro light emitting diode as claimed in claim 7, further comprising an insulation layer disposed on a side surface of the epitaxial stacked layer and a part of a top surface of the epitaxial stacked layer to expose the first mesa portion and the second mesa portion.

9. The micro light emitting diode as claimed in claim 8, wherein the second electrode covers a part of the insulation layer.

10. The micro light emitting diode as claimed in claim 8, wherein the insulation layer is extended to a surface of the substrate from the side surface of the epitaxial stacked layer.

11. The micro light emitting diode as claimed in claim 8, wherein the epitaxial stacked layer further includes an unintentionally doped semiconductor layer, and the unintentionally doped semiconductor layer is located between the second type doped semiconductor layer and the substrate.

12. The micro light emitting diode as claimed in claim 8, wherein the insulation layer and the first electrode have a first gap there between, and the insulation layer and the second electrode have a second gap there between.

13. The micro light emitting diode as claimed in claim 7, wherein the substrate is a patterned substrate.

14. The micro light emitting diode as claimed in claim 1, wherein the first electrode directly contacts the first type doped semiconductor layer on the first mesa portion.

15. The micro light emitting diode as claimed in claim 1, wherein a diagonal length of the micro light emitting diode ranges between 10 µm and 100 µm.

16. A manufacturing method of a micro light emitting diode, comprising:
  providing a substrate;
  forming an epitaxial stacked layer on the substrate, wherein the epitaxial stacked layer includes a first type doped semiconductor layer, a light emitting layer and a second type doped semiconductor layer, the light emitting layer is located between the first type doped semiconductor layer and the second type doped semiconductor layer, and the first type doped semiconductor layer and the second type doped semiconductor layer are opposite in electrical property;
  etching the epitaxial stacked layer to make the epitaxial stacked layer have a first mesa portion and a second mesa portion to form a first type conductive region and a second type conductive region respectively; and
  respectively forming a first electrode on the first mesa portion in the first type conductive region and forming a second electrode on the second mesa portion in the second type conductive region, wherein the first electrode and the second electrode are electrically connected to the epitaxial stacked layer,
  wherein the second electrode contacts the first type doped semiconductor layer, the light emitting layer and the second type doped semiconductor layer of the second mesa portion.

17. The manufacturing method of the micro light emitting diode as claimed in claim 16, wherein the step of etching the epitaxial stacked layer comprises:
  etching a part of the first type doped semiconductor layer, a part of the light emitting layer and a part of the second type doped semiconductor layer to make the epitaxial stacked layer have a first recess portion and a second recess portion,
  wherein the first recess portion defines the first mesa portion and the second mesa portion to form the first type conductive region and the second type conductive region respectively, and
  the second recess portion defines a first sub mesa portion and a second sub mesa portion in the second mesa portion.

18. The manufacturing method of the micro light emitting diode as claimed in claim 16, wherein the step of etching the epitaxial stacked layer to make the epitaxial stacked layer have the first mesa portion and the second mesa portion comprises:
  etching the epitaxial stacked layer to expose a part of the substrate.

19. The manufacturing method of the micro light emitting diode as claimed in claim 18, wherein after the step of etching the epitaxial stacked layer to expose a part of the substrate, the manufacturing method further comprises:
forming an insulation layer on a side surface of the epitaxial stacked layer and a part of a top surface of the epitaxial stacked layer to expose the first mesa portion and the second mesa portion.

20. The manufacturing method of the micro light emitting diode as claimed in claim 16, wherein before the step of respectively forming the first electrode and the second electrode on the first mesa portion and the second mesa portion, the manufacturing method further comprises:
forming a current spreading layer on the epitaxial stacked layer.

21. A manufacturing method of micro light emitting diodes, comprising;
providing a substrate;
forming an epitaxial stacked layer on the substrate, wherein the epitaxial stacked layer comprises a first type doped semiconductor layer, a light emitting layer and a second type doped semiconductor layer, the light emitting layer is located between the first type doped semiconductor layer and the second type doped semiconductor layer, and the first type doped semiconductor layer and the second type doped semiconductor layer are opposite in electrical property;
etching the epitaxial stacked layer to make the epitaxial stacked layer to form a plurality of sub epitaxial stacked layers separated from each other, wherein each of the sub epitaxial stacked layers comprises a part of the first type doped semiconductor layer, a part of the light emitting layer and a part of the second type doped semiconductor layer;
etching each of the sub epitaxial stacked layers to make each of the sub epitaxial stacked layers have a first mesa portion and a second mesa portion to form a first type conductive region and a second type conductive region respectively; and
forming a plurality of first electrodes on the first mesa portions in the first type conductive regions, and forming a plurality of second electrodes on the second mesa portions in the second type conductive regions, wherein each of the first electrodes is electrically connected to the corresponding sub epitaxial stacked layer, and each of the second electrodes is electrically connected to the corresponding sub epitaxial stacked layer, so as to form a plurality of micro light emitting diodes on the substrate,
wherein in each of the micro light emitting diodes,
the second electrode contacts the first type doped semiconductor layer, the light emitting layer and the second type doped semiconductor layer of the corresponding second mesa portion.

22. The manufacturing method of the micro light emitting diodes as claimed in claim 21, wherein the step of etching each of the sub epitaxial stacked layers further comprises:
etching a part of the first type doped semiconductor layer, a part of the light emitting layer and a part of the second type doped semiconductor layer in each of the sub epitaxial stacked layers to make each of the sub epitaxial stacked layers have a first recess portion and a second recess portion,
wherein the first recess portion defines the first mesa portion and the second mesa portion to form the first type conductive region and the second type conductive region respectively, and the second recess portion defines a first sub mesa portion and a second sub mesa portion in the second mesa portion.

23. The manufacturing method of the micro light emitting diodes as claimed in claim 22, wherein an area of an orthogonal projection of the first mesa portion is substantially the same to an area of an orthogonal projection of the second mesa portion.

24. The manufacturing method of the micro light emitting diodes as claimed in claim 21, wherein after the step of forming the micro light emitting diodes on the substrate, the manufacturing method further comprises:
providing a temporary substrate;
selecting at least a part of the micro light emitting diodes on the substrate as a predetermined detaching portion, and detaching the micro light emitting diodes in the predetermined detaching portion from the substrate; and
transferring the detached micro light emitting diodes in the predetermined detaching portion to the temporary substrate.

25. The manufacturing method of the micro light emitting diodes as claimed in claim 24, wherein any of the micro light emitting diodes in the predetermined detaching portion on the temporary substrate is a first micro light emitting diode, wherein
the first micro light emitting diode is located adjacent to a second micro light emitting diode of the micro light emitting diodes in a first direction, and the first micro light emitting diode and the second micro light emitting diode have a first gap there between,
the first micro light emitting diode is located adjacent to a third micro light emitting diode of the micro light emitting diodes in a second direction different to the first direction, and the first micro light emitting diode and the third micro light emitting diode have a second gap there between.

* * * * *